(12) United States Patent
Kim et al.

(10) Patent No.: US 10,714,686 B2
(45) Date of Patent: Jul. 14, 2020

(54) VARIABLE RESISTANCE MEMORY DEVICES AND METHODS OF FORMING THE SAME

(71) Applicant: Samsung Electronics Co., Ltd., Suwon-si, Gyeonggi-do (KR)

(72) Inventors: Sungwon Kim, Hwaseong-si (KR); Sung-Ho Eun, Seoul (KR); Ilmok Park, Seoul (KR); Junghoon Park, Yongin-si (KR); Seulji Song, Yongin-si (KR); Ji-Hyun Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 83 days.

(21) Appl. No.: 15/869,892

(22) Filed: Jan. 12, 2018

(65) Prior Publication Data

US 2019/0019950 A1 Jan. 17, 2019

(30) Foreign Application Priority Data

Jul. 14, 2017 (KR) ........................ 10-2017-0089796

(51) Int. Cl.
*H01L 45/00* (2006.01)
*G11C 13/00* (2006.01)
*H01L 27/24* (2006.01)

(52) U.S. Cl.
CPC ...... *H01L 45/1675* (2013.01); *G11C 13/0004* (2013.01); *G11C 13/0026* (2013.01); *G11C 13/0028* (2013.01); *H01L 27/2427* (2013.01); *H01L 27/2463* (2013.01); *H01L 45/122* (2013.01); *H01L 45/1273* (2013.01); *H01L 45/141* (2013.01); *H01L 45/1683* (2013.01);
(Continued)

(58) Field of Classification Search
CPC ..... H01L 45/141; H01L 45/144; H01L 45/04; H01L 45/122; H01L 45/1675
See application file for complete search history.

(56) References Cited

U.S. PATENT DOCUMENTS 7,554,147 B2 6/2009 Asano et al.
7,767,568 B2 8/2010 An et al.
(Continued)

FOREIGN PATENT DOCUMENTS

JP 2014-045224 3/2014
KR 10-0819560 4/2008
(Continued)

*Primary Examiner* — Phat X Cao
(74) *Attorney, Agent, or Firm* — Myers Bigel, P.A.

(57) ABSTRACT

Variable resistance memory devices and methods of forming the same are provided. The variable resistance memory devices may include a substrate including a cell region and a peripheral region, first conductive lines on the substrate, second conductive lines traversing the first conductive lines, variable resistance structures at intersecting points of the first conductive lines and the second conductive lines, and bottom electrodes between the first conductive lines and the variable resistance structures. The cell region may include a boundary region contacting the peripheral region, and one of the first conductive lines is electrically insulated from one of the variable resistance structures that is on the boundary region and overlaps the one of the first conductive lines.

15 Claims, 42 Drawing Sheets

(52) U.S. Cl.
CPC ...... *H01L 45/1691* (2013.01); *G11C 2213/31* (2013.01); *G11C 2213/76* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/147* (2013.01)

(56) References Cited

U.S. PATENT DOCUMENTS

| | | | |
|---|---|---|---|
| 9,136,466 B2 | 9/2015 | Son | |
| 2004/0248339 A1* | 12/2004 | Lung | H01L 45/06 438/102 |
| 2012/0286228 A1* | 11/2012 | Son | H01L 45/06 257/4 |
| 2015/0263071 A1* | 9/2015 | Sim | H01L 27/2463 710/5 |

FOREIGN PATENT DOCUMENTS

| | | |
|---|---|---|
| KR | 10-1124322 | 3/2012 |
| KR | 10-1298189 | 8/2013 |
| KR | 1020180064084 A | 6/2018 |

* cited by examiner

VARIABLE RESISTANCE MEMORY DEVICES AND METHODS OF FORMING THE SAME

CROSS-REFERENCE TO RELATED APPLICATION

This U.S. non-provisional patent application claims priority under 35 U.S.C. § 119 to Korean Patent Application No. 10-2017-0089796, filed on Jul. 14, 2017, in the Korean Intellectual Property Office, the disclosure of which is hereby incorporated by reference in its entirety.

BACKGROUND

The present inventive concepts generally relate to the field of electronics and, more particularly, to a variable resistance memory device and a method of forming the same.

Semiconductor devices may be classified into memory devices and logic devices. Memory devices may store data and may be classified into volatile memory devices and non-volatile memory devices. Volatile memory devices may lose stored data when power supplies are interrupted, and non-volatile memory devices may retain stored data even when power supplies are interrupted.

Next-generation semiconductor memory devices e.g., ferroelectric random-access memory (FRAM) devices, magnetic random access memory (MRAM) devices, and phase-change random access memory (PRAM) devices) have been developed to provide high-performance and tow power consuming semiconductor memory devices. Materials of these next-generation semiconductor memory devices may have resistance values variable according to currents or voltages applied thereto and may retain their resistance values even when currents or voltages are interrupted.

SUMMARY

Some embodiments of the inventive concepts may provide variable resistance memory devices with improved reliability and methods of forming the same.

Some embodiments of the inventive concepts may also provide variable resistance memory devices with improved electrical characteristics and methods of forming the same.

An object of the present inventive concepts is not limited to the mentioned above, other objects which have not been mentioned above will be clearly understood to those skilled in the art from the following description.

According to some embodiments of the present inventive concepts, variable resistance memory devices, may include a substrate including a cell region and a peripheral region, a plurality of first conductive lines extending in a first direction on the substrate, a plurality of second conductive lines extending in a second direction and traversing the plurality of first conductive lines, and a plurality of variable resistance structures. Each of the plurality of variable resistance structures may be at one of a plurality of intersecting points of the plurality of first conductive lines and the plurality of second conductive lines. The variable resistance memory devices may also include a plurality of bottom electrodes between the plurality of first conductive lines and the plurality of variable resistance structures. The cell region may include a boundary region that is in contact with the peripheral region. One of the plurality of first conductive lines may be electrically insulated from one of the plurality of variable resistance structures that is on the boundary region and overlaps the one of the plurality of first conductive lines.

According to some embodiments of the present inventive concepts, variable resistance memory devices may include a conductive line extending on a substrate and a plurality of variable resistance structures including a first one of the plurality of variable resistance structures and a second one of the plurality of variable resistance structures that both overlap the conductive line. The first one of the plurality of variable resistance structures may be electrically insulated from the conductive line, and the second one of the plurality of variable resistance structures may be configured to be electrically connected to the conductive line.

According to some embodiments of the present inventive concepts, variable resistance memory devices may include a plurality of variable resistance structures on a substrate, and the plurality of variable resistance structures may include lower surfaces, respectively. The variable resistance memory devices may also include an insulating layer between the substrate and the plurality of variable resistance structures. An entirety of a first one of the lower surfaces of a first one of the plurality of variable resistance structures contacts the insulating layer.

According to some embodiments of the present inventive concepts, methods of forming variable resistance memory devices may include providing a substrate including a cell region and a peripheral region, forming first conductive lines extending in a first direction on the substrate, forming bottom electrodes on the first conductive lines, forming memory cells on the cell region, and forming second conductive lines intersecting the first conductive lines. The cell region may include a boundary region that is in contact with the peripheral region. Each of the memory cells may include a switching element and a variable resistance structure connected in series between a corresponding one of the first conductive lines and a corresponding one of the second conductive lines. Some of the variable resistance structures that are formed on the boundary region may be electrically insulated from the first conductive lines.

BRIEF DESCRIPTION OF THE DRAWINGS

The inventive concepts will become more apparent in view of the attached drawings and accompanying detailed description.

DETAILED DESCRIPTION

Variable resistance memory devices and methods of forming the variable resistance memory devices according to the inventive concepts will be described hereinafter with reference to the drawings. Like reference numbers refer to like elements throughout.

As used herein the term "and/or" includes any and all combinations of one or more of the associated listed items. It will be understood that an element A overlapping an element B" (or similar language) means that there is a vertical line that intersects both the elements A and B that are spaced apart from each other in a vertical direction. It will be also understood that "performed concurrently" (or similar language) refers to performed at approximately (but not necessarily exactly) the same time.

FIGS. 1A to 8A are plan views illustrating a method of forming a variable resistance memory device according to some embodiments of the inventive concepts. FIGS. 1B to 8B are cross-sectional views taken along the lines of FIGS. 1A to 8A, respectively. FIGS. 1C to 8C are cross-sectional views taken along the lines II-II' of FIGS. 1A to 8A, respectively.

Figure 1A:
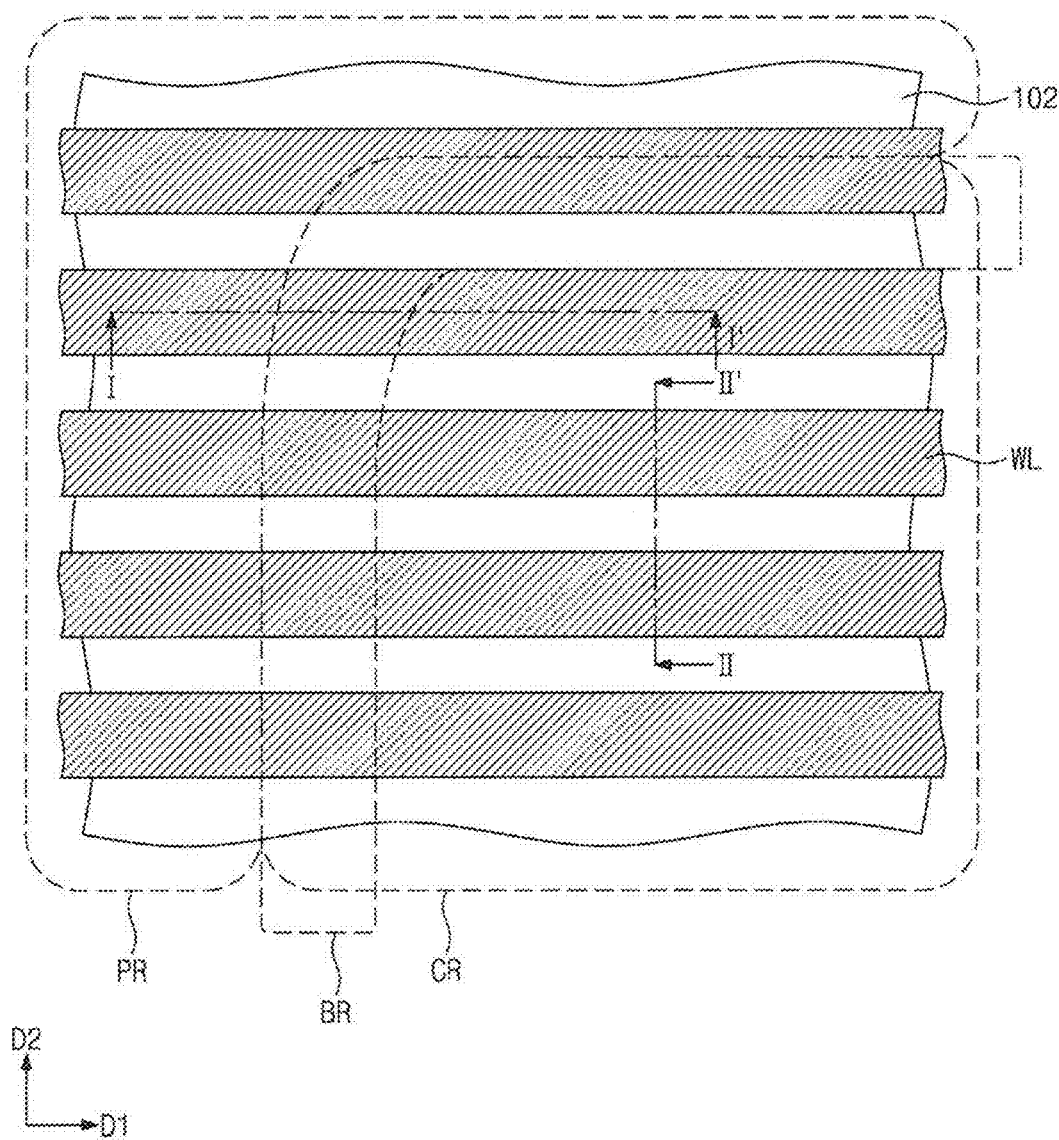
FIGS. 1A, 2A, 3A, 4A, 5A, 6A, 7A, and 8A are plan views illustrating a method of forming a variable resistance memory device according to some embodiments of the inventive concepts.
Figure 1B:
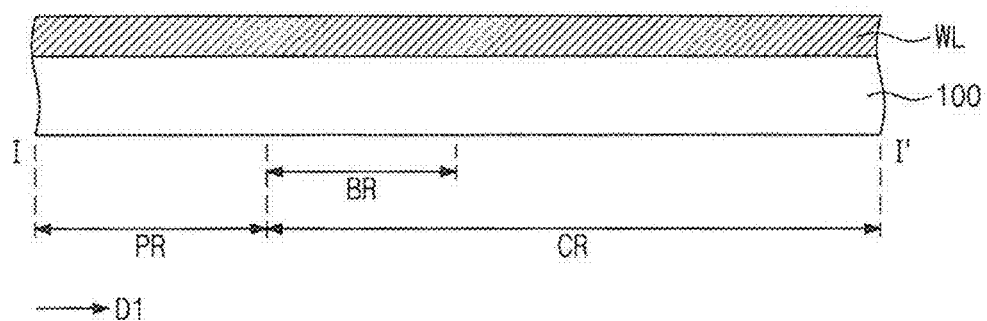
FIGS. 1B, 2B, 3B, 4B, 5B, 6B, 7B, and 8B are cross-sectional views taken along the lines of FIGS. 1A to 8A, respectively.
Figure 1C:
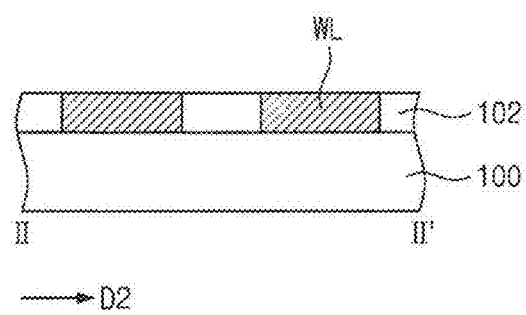
FIGS. 1C, 2C, 3C, 4C, 5C, 6C, 7C, and 8C are cross-sectional views taken along the lines II-II' of FIGS. 1A to 8A, respectively.

Referring to FIGS. 1A to 1C, a substrate 100 may be provided. The substrate 100 may include a cell region CR and a peripheral region PR. Memory cells (e.g., MC in FIGS. 8B and 8C) for storing data (e.g., logic data) may be formed on the cell region CR of the substrate 100, and transistors for driving the memory cells may be formed on the peripheral region PR of the substrate 100. Each of the memory cells may include a switching element (e.g., SW in FIGS. 8B and 8C) and a variable resistance structure (e.g., 140_C in FIGS. 8B and 8C), which will be described, later herein. The cell region CR may be in contact with the peripheral region PR. Here a portion of the cell region CR, which is in contact with the peripheral region PR, may be referred to as a boundary region BR. The substrate 100 may include, for example, a single-crystalline semiconductor material. For example, the substrate 100 may be a silicon (Si) substrate, a silicon-on-insulator (SOI) substrate, a germanium (Ge) substrate, a germanium-on-insulator (GOI) substrate, or a silicon-germanium (SiGe) substrate.

Word lines WL and a first interlayer insulating layer 102 may be formed on the substrate 100. In some embodiments, a conductive material may be formed on the substrate 100, and then, a patterning process may be performed on the conductive material to form the word lines WL. An insulating layer may be formed on the substrate 100 to cover the word lines WL. A planarization process may be performed on the insulating layer to form the first interlayer insulating layer 102. At this time, top surfaces of the word lines WL may be exposed. In some embodiments, the first interlayer insulating layer 102 including trenches may be formed on the substrate 100, and the word lines WL may be formed in the trenches by filling the trenches with a conductive material. The word lines WL may extend in a first direction D1 and may be parallel to each other. The first interlayer insulating layer 102 may include, for example, silicon nitride. The word lines WL may include at least one of a metal material (e.g., copper (Cu) or aluminum (Al)) or a conductive metal nitride (e.g., titanium nitride (TiN) or tungsten nitride (WN)). The first direction D1 may be referred to as a first horizontal direction that is parallel to an upper surface of the substrate 100.

Figure 2A:
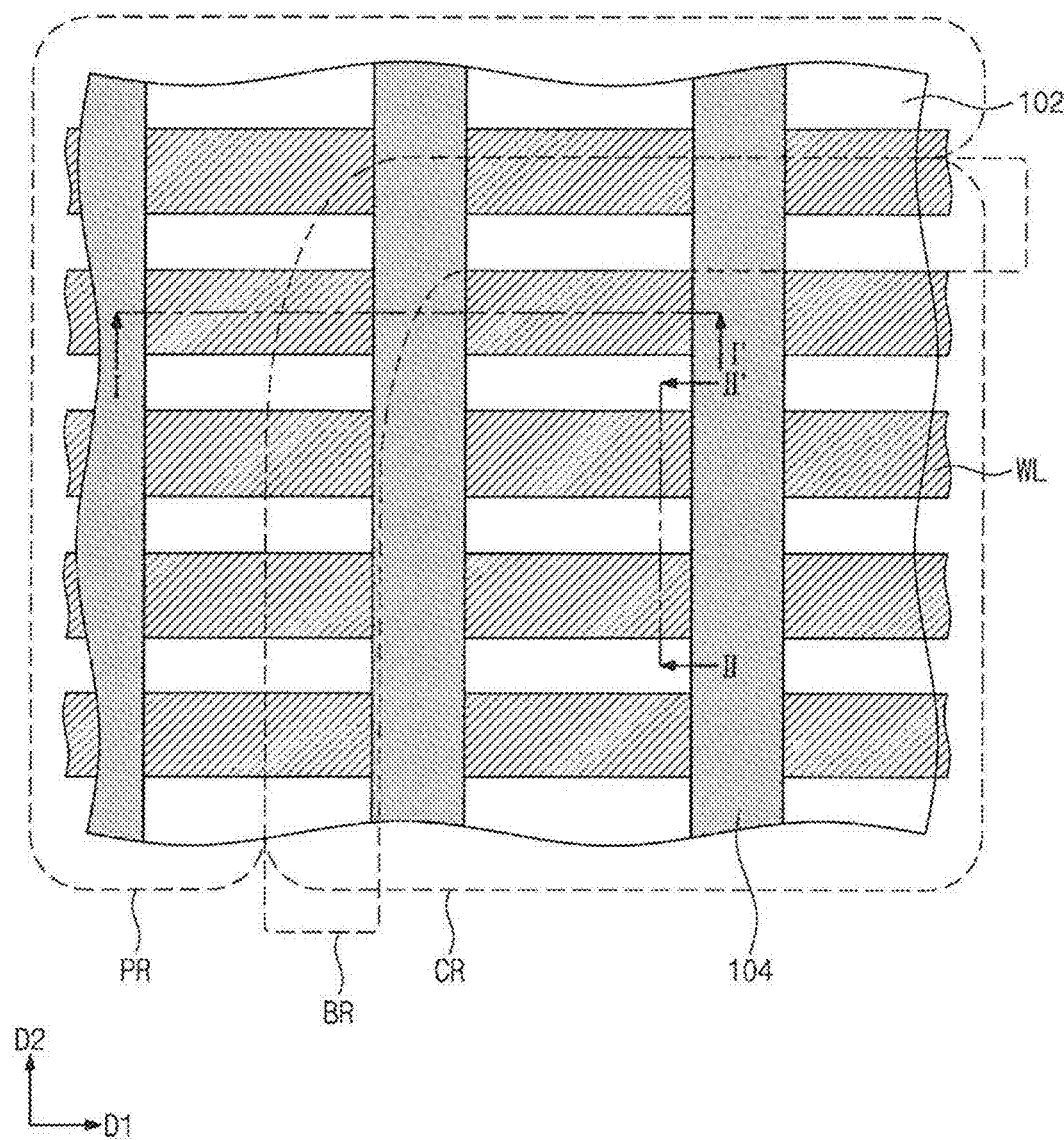
Figure 2B:
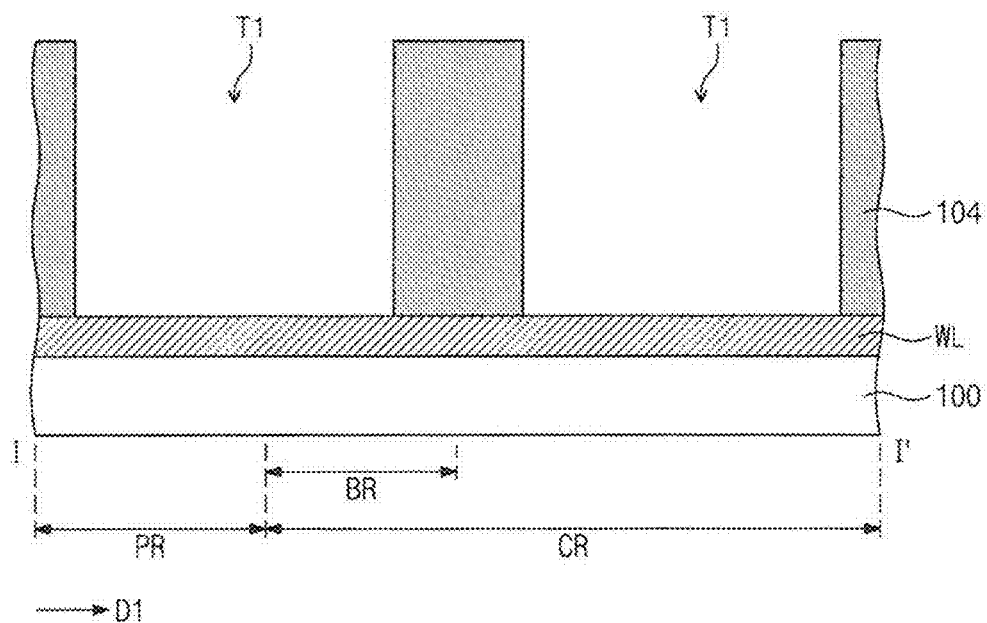
Figure 2C:
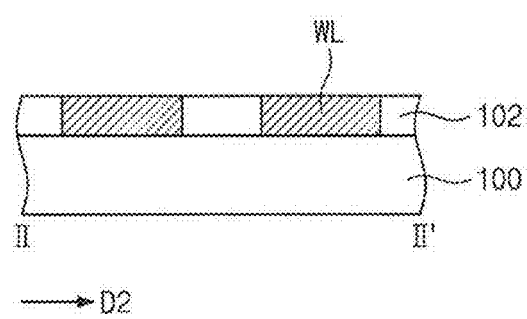

Referring to FIGS. 2A to 2C, a first insulating layer 104 may be formed on the first interlayer insulating layer 102. The first insulating layer 104 may include first trenches T1. The first trenches T1 may extend in a second direction D2 intersecting the first direction D1. The second direction D2 may be referred to as a second horizontal direction that is parallel to an upper surface of the substrate 100. The first trenches T1 may expose portions of the word lines WL and portions of the first interlayer insulating layer 102. The first insulating layer 104 may include, for example, silicon nitride.

Figure 3A:
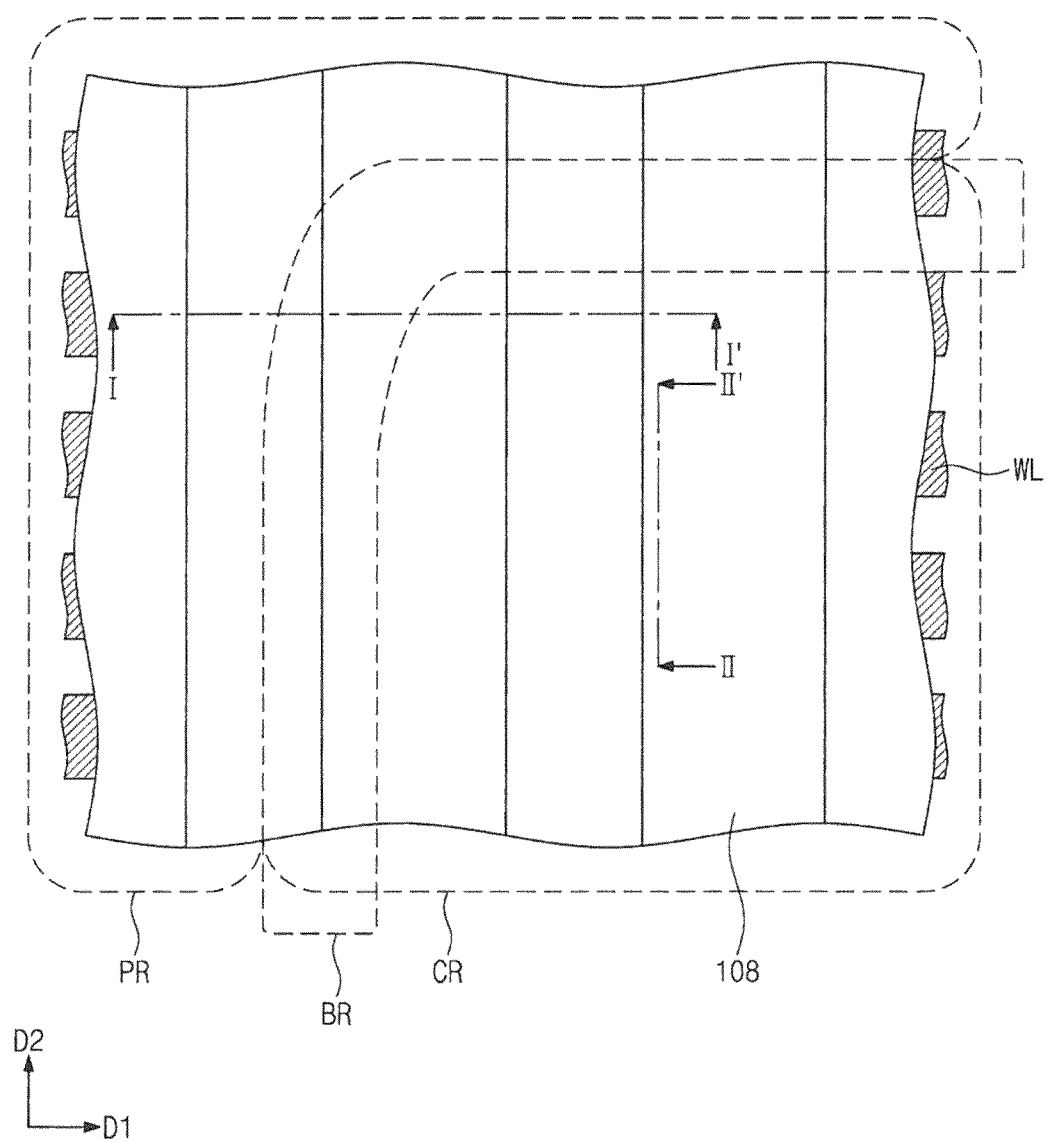
Figure 3B:
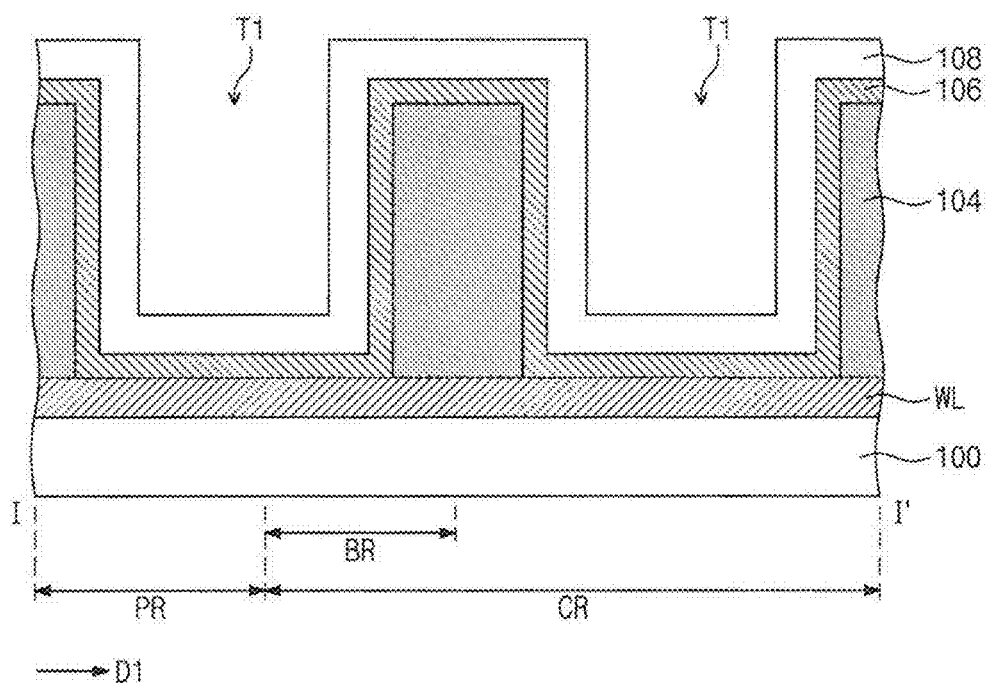
Figure 3C:
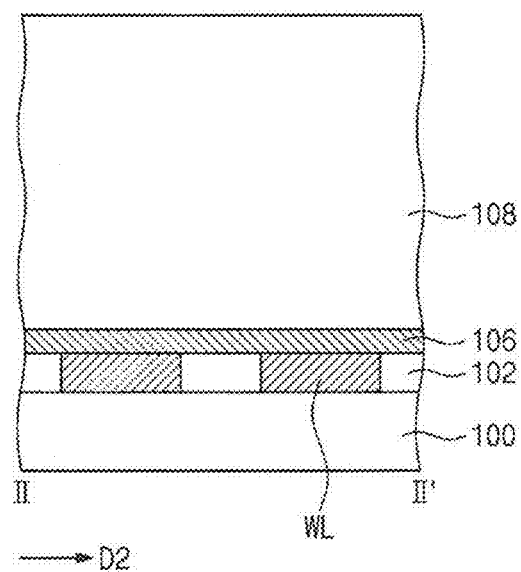

Referring to FIGS. 3A to 3C, a conductive layer 106 and a spacer layer 108 may be deposited on the substrate 100. In more detail, the conductive layer 106 may be formed to conformally cover sidewalls of the first insulating layer 104 exposed by the first trenches T1, a top surface of the first insulating layer 104, top surfaces of the portions of the word lines WL exposed by the first trenches T1, and a top surface of the first interlayer insulating layer 102 exposed by the first trenches T1. Thereafter, the spacer layer 108 may be formed to conformally cover a top surface of the conductive layer 106.

The conductive layer 106 may include a conductive material. For example, the conductive material may include at least one of W, Ti, Al, Cu, C, CN, TiN, TiAlN, TiSiN, TiCN, WN, CoSiN, WSiN, TaN, TaCN, TaSiN, or TiO.

The spacer layer 108 may include an insulating material. For example, the spacer layer 108 may include silicon oxide. In some embodiments, the spacer layer 108 may include a conductive material. For example, the spacer layer 108 may include poly-silicon. The spacer layer 108 may have an etch selectivity with respect to the first interlayer insulating layer 102 and the first insulating layer 104.

Figure 4A:
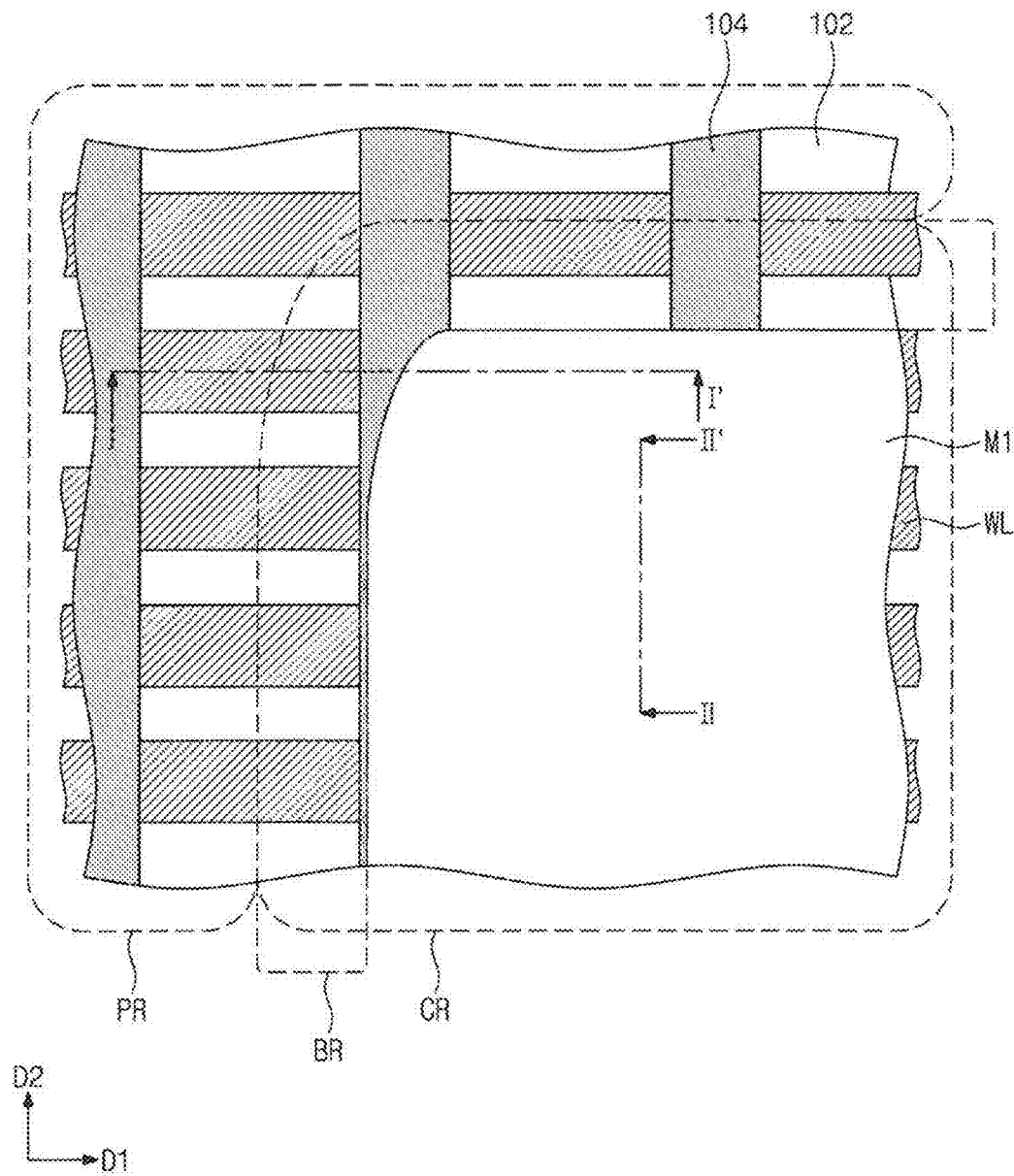
Figure 4B:
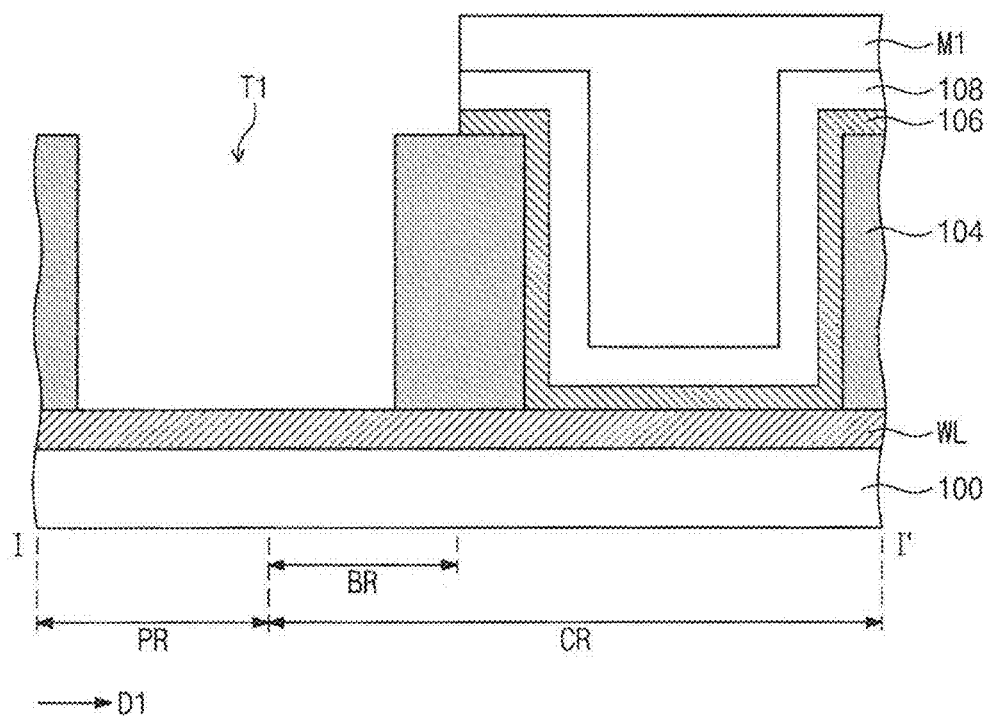
Figure 4C:
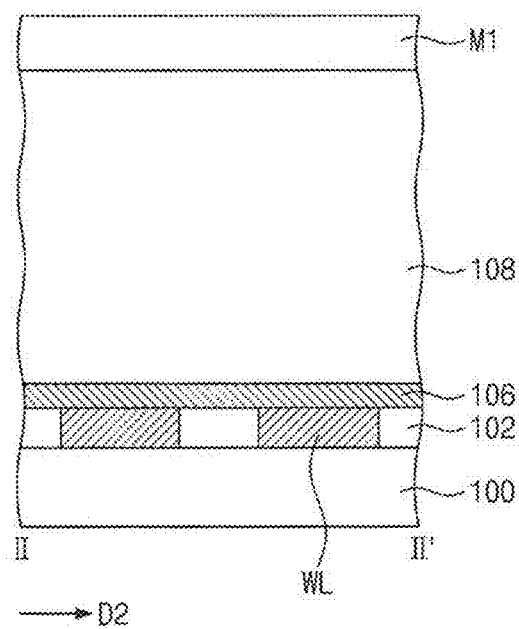

Referring to FIGS. 4A to 4C, a portion of the conductive layer 106 and a portion of the spacer layer 108 may be removed. In more detail, the conductive layer 106 and the spacer layer 108 on the boundary region BR may be etched. For example, a first mask pattern M1 may be formed on the substrate 100. The first mask pattern M1 may cover the cell region CR but may expose the boundary region BR. The conductive layer 106 and the spacer layer 108 on the boundary region BR may be removed using the first mask pattern M1 as a mask (e.g., an etch mask). The conductive layer 106 and the spacer layer 108 may be removed to expose a bottom surface of the first trench T1 on the boundary region BR. In other words, portions of the top, surfaces of the word lines WL and portions of the top surface of the first interlayer insulating layer 102 may be exposed on the boundary region BR. At this time, the conductive layer 106 and the spacer layer 108 on the peripheral region PR may also be removed. Thus, the conductive layer 106 and the spacer layer 108 may remain on the cell region CR but may be removed from the peripheral region PR and the boundary region BR adjacent to the peripheral region PR.

Unlike FIGS. 4A and 4B, in some embodiments, the conductive layer 106 and the spacer layer 108 on the peripheral region PR may not be removed and may remain on the peripheral region PR. For example, the first mask pattern M1 may cover the cell region CR and the peripheral region PR but may expose the boundary region BR.

Figure 5A:
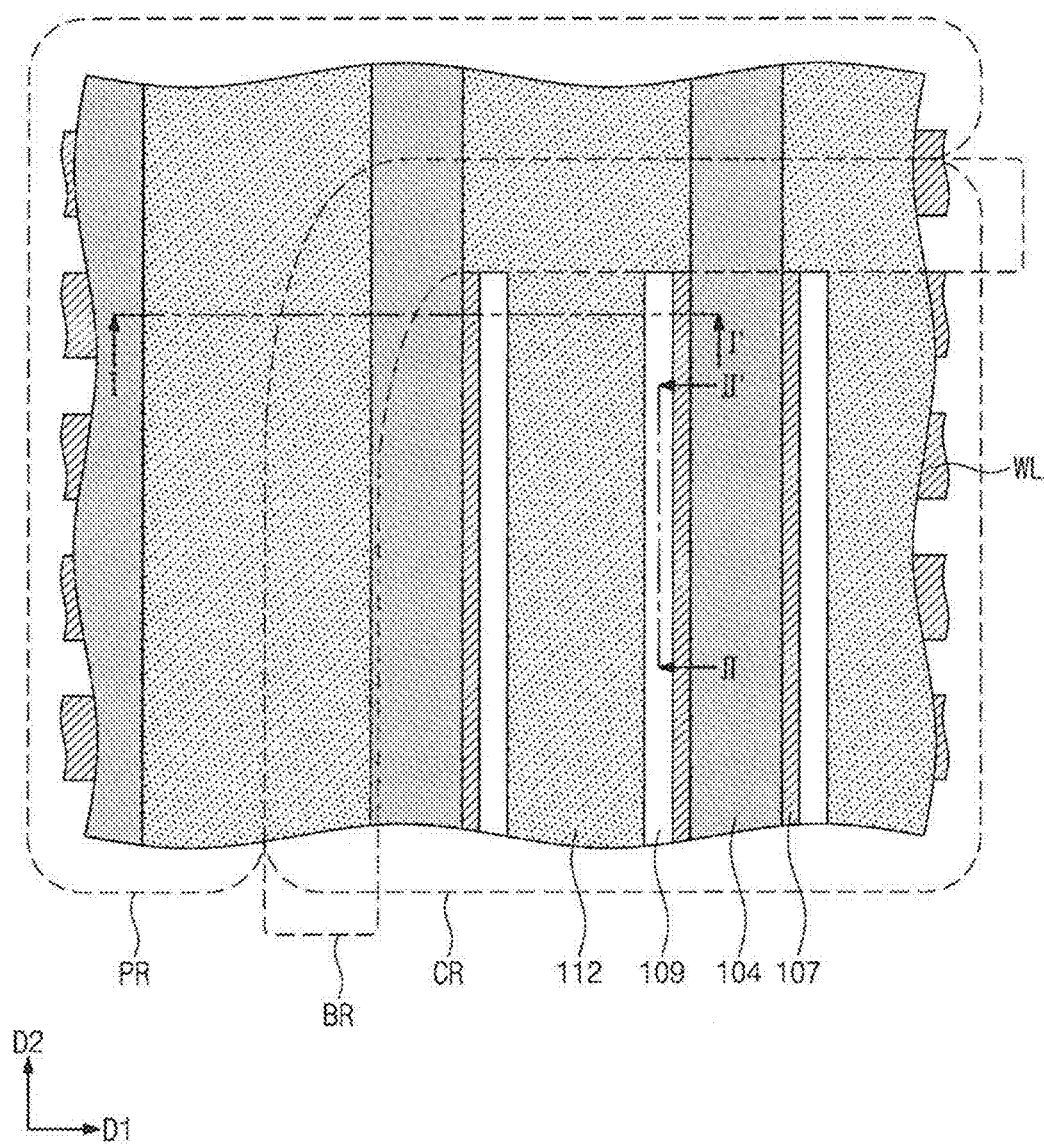
Figure 5B:
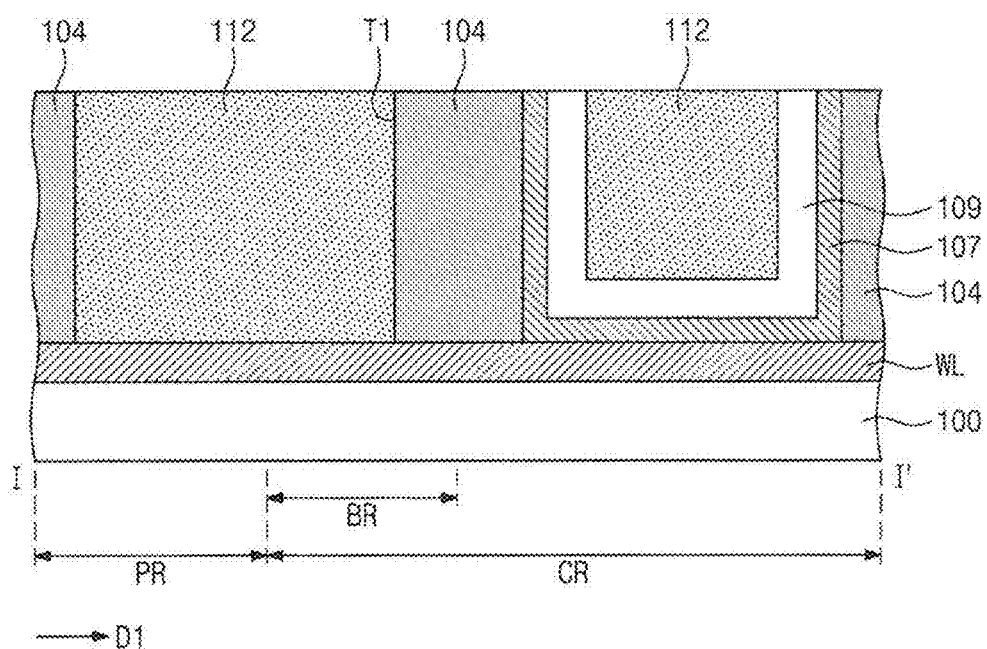
Figure 5C:
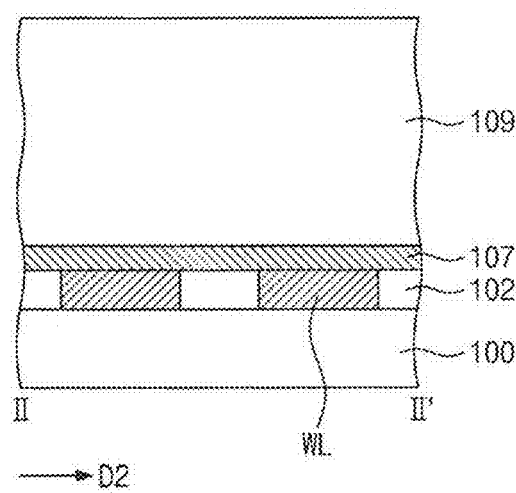

Referring to FIGS. 5A to 5C, the first mask pattern M1 may be removed, and then, a second insulating pattern 112 may be formed in the first trenches T1. In more detail, on the cell region CR, a second insulating layer may be formed on the spacer layer 108 to till a remaining region of the first trench T1. The second insulating layer may also fill the first trenches T1 on the boundary region BR and the peripheral region PR. In other words, the second insulating layer may be in contact with the bottom surface of the first trench T1 on the boundary region BR. Thereafter, a planarization process may be performed on the second insulating layer, the spacer layer 108 and the conductive layer 106 until the top surface of the first insulating layer 104 is exposed thereby forming an electrode pattern 107, a spacer pattern 109 and the second insulating pattern 112, which are sequentially stacked in the first trench T1. The electrode pattern 107 and the spacer pattern 109 may be formed on the cell region CR but may not be formed on the boundary region BR. The second insulating pattern 112 may be formed on both the cell region CR and the boundary region BR. The second insulating pattern 112 may be in, contact with the bottom surface of the first trenches T1 on the boundary region BR. In other words, the second insulating pattern 112 may be in contact with the top surfaces of the word lines WL exposed by the first trenches T1 on the boundary region BR. Thus, the second insulating pattern 112 may insulate a portion of the word line WL on the boundary region BR from a variable resistance structure on the boundary region BR (e.g., 140_B in FIGS. 8B and 8C). The electrode pattern 107, the spacer pattern 109, the first insulating layer 104, and the second insulating pattern 112 may extend in the second direction D2.

The second insulating pattern 112 may include an insulating material having an etch selectivity with respect to the sparer pattern 109. For example, the second insulating pattern 112 may include silicon nitride.

Figure 6A:
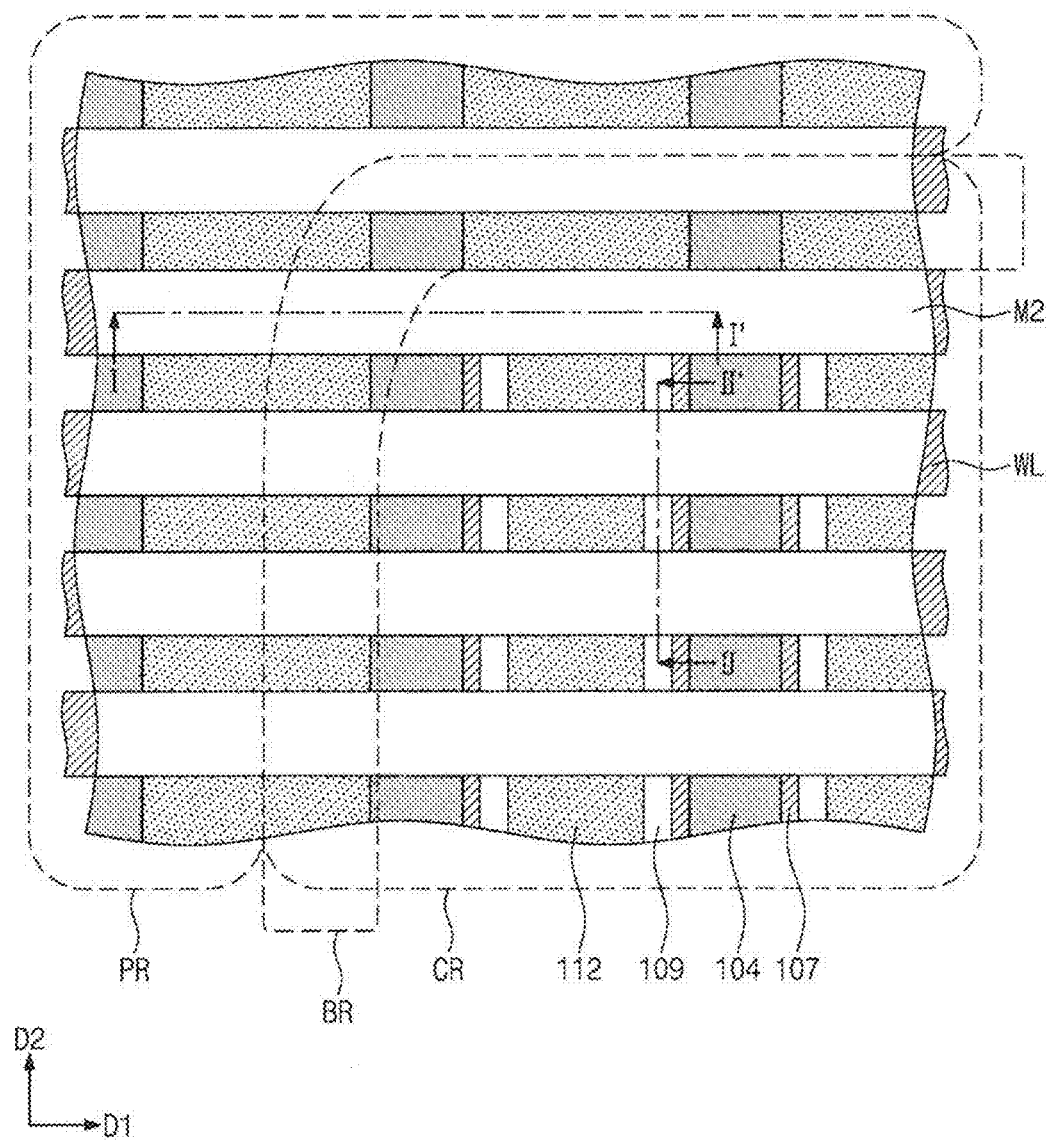
Figure 6B:
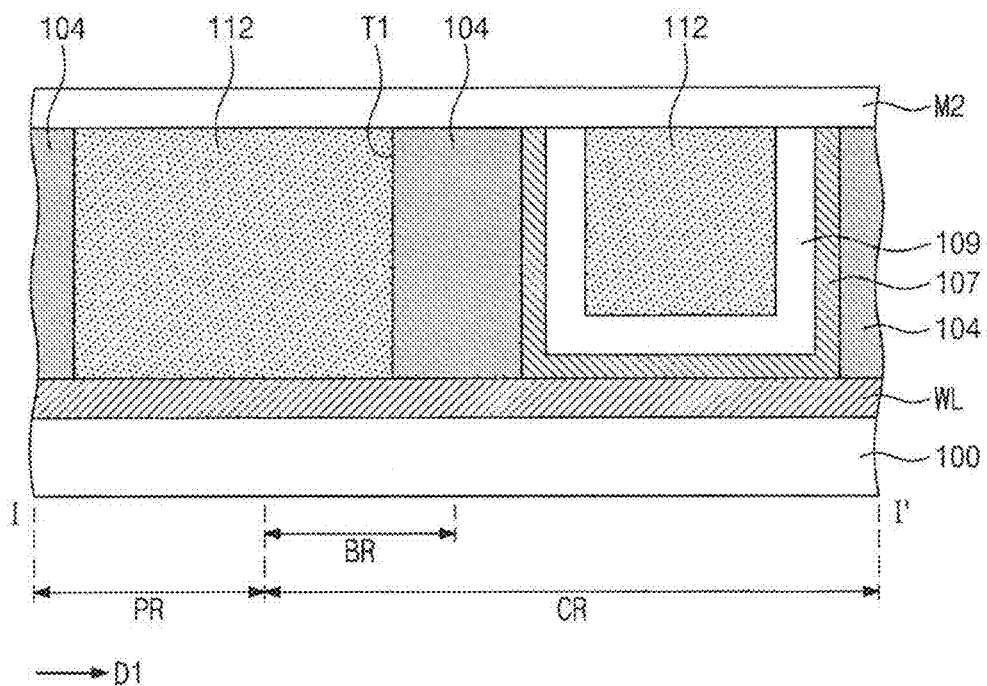
Figure 6C:
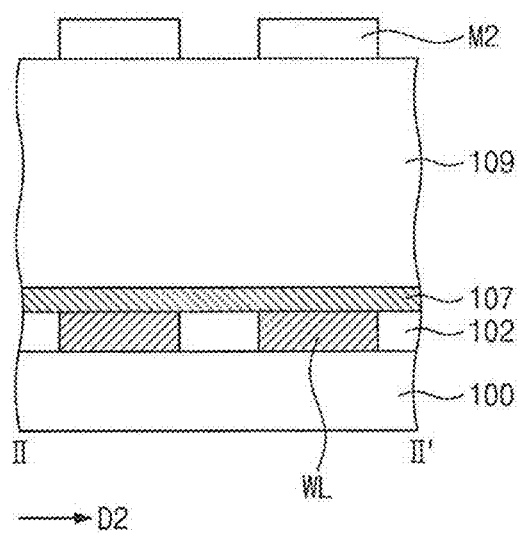

Referring to FIGS. 6A to 6C, second mask patterns M2 may be formed on the first insulating layer 104 and the second insulating pattern 112. The second mask patterns M2 may extend in the first direction D1 and may be parallel to each other. The second mask patterns M2 may expose portions of the electrode pattern 107, the spacer pattern 109, the second insulating pattern 112 and the first insulating layer 104. For example, the second mask patterns M2 may include silicon oxide, silicon nitride, or poly-silicon.

Figure 7A:
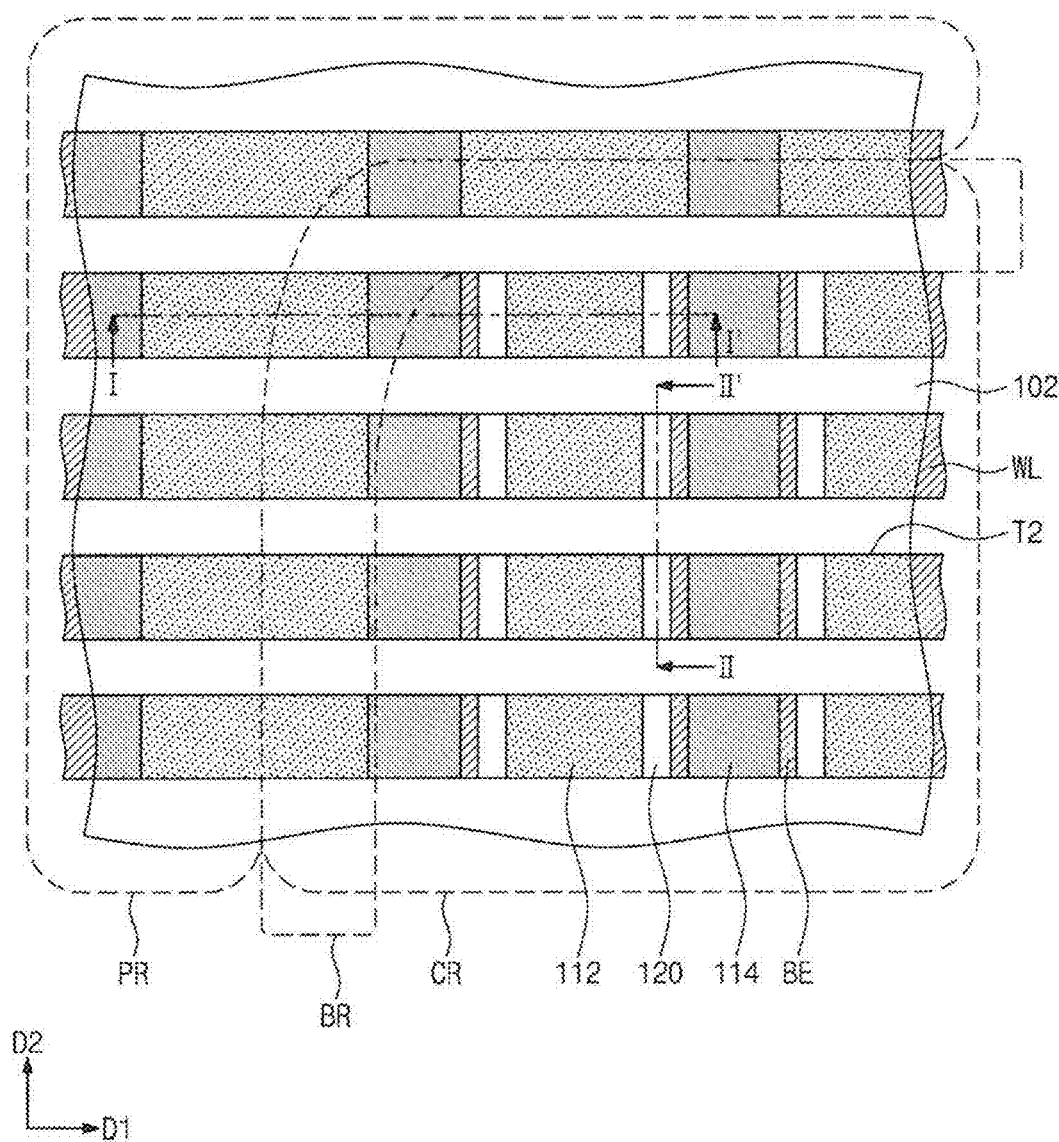
Figure 7B:
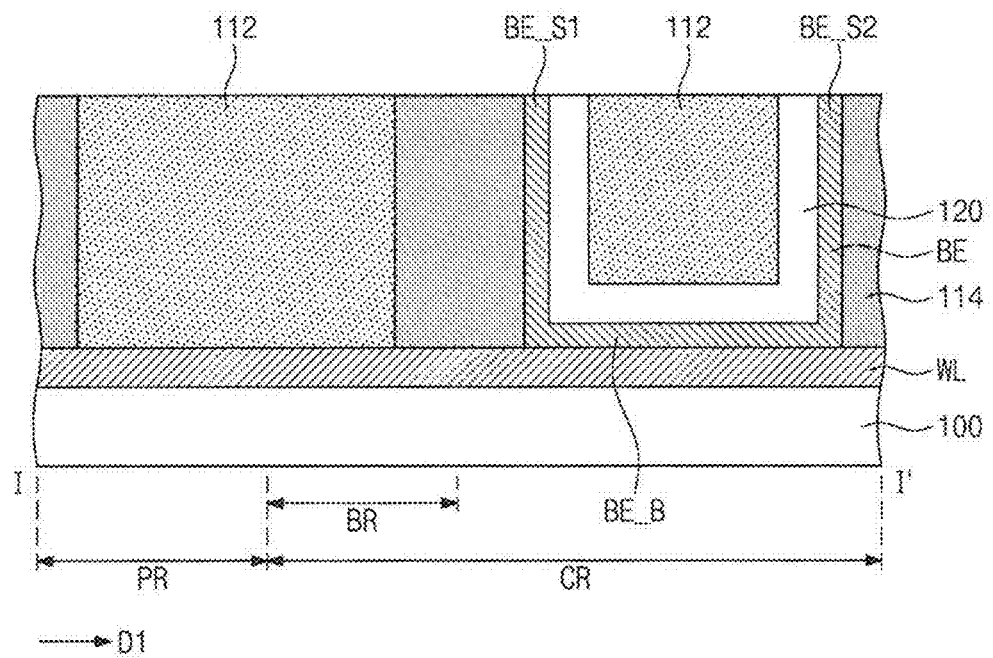
Figure 7C:
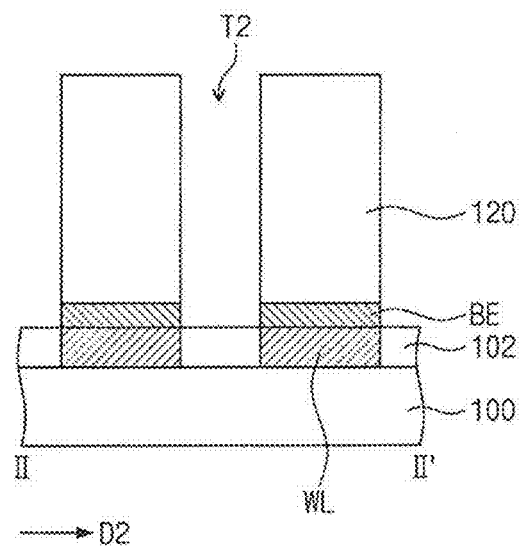

Referring to FIGS. 7A to 7C, the electrode pattern 107, the spacer pattern 109, the second insulating pattern 112 and the first insulating layer 104 may be patterned using the second, mask patterns M2 as an etch mask. Thus, a second trench T2 may be formed on the top surface of the first interlayer insulating layer 102 between the word lines WL. Bottom electrodes BE, spacers 120, and first insulating patterns 114 may be formed on the word lines WL by the patterning process. For example, the electrode pattern 107 may be etched to form the bottom electrodes BE, and the spacer pattern 109 may be etched to form the spacers 120. The first insulating layer 104 may be etched to form the first insulating patterns 114. By the patterning process, the second insulating pattern 112 may be formed into a plurality of patterns separated from each other in the second direction D2. Sidewalls of the second insulating patterns 112, which face each other in the second direction D2, may be exposed by the second trench T2.

The bottom electrodes BE may be spaced apart from each other in the first direction D1 and the second direction D2. Sidewalls of the bottom electrodes BE, which face each other in, the second direction D2, may be exposed by the second trench T2. Each of the bottom electrodes BE may include a bottom portion BE_B, a first sidewall portion BE_S1 and a second sidewall portion BE_S2, as illustrated in FIG. 7B. The bottom portion BE_B may be disposed on the bottom surface of the first trench T1 and may be electrically connected to the word line WL. The first sidewall portion BE_S1 and the second sidewall portion BE_S2 may be physically connected to each other through the bottom portion BE_B extending between the spacer 120 and the word line WL. For example, the first sidewall portion BE_S1 and the second sidewall portion BE_S2 may be connected to opposing ends of the bottom portion BE_B, respectively. The first sidewall portion BE_S1 and the second sidewall portion BE_S2 may extend upwardly from the opposing ends, of the bottom portion BE_B, respectively. The first sidewall portion BE_S1 and the second sidewall portion BE_S1 may be connected to memory cells (e.g., MC in FIGS. 8B and 8C), which will be described later, respectively. In other words, each of the bottom electrodes BE may act as a common electrode of adjacent memory cells due to the first sidewall portion, and the second sidewall portion. Alternatively, even though not shown in the drawings, the first sidewall portion and the second sidewall portion may be physically separated from each other.

The spacers 120 may be formed between the bottom electrodes BE and the second insulating patterns 112. The spacers 120 may be spaced apart from each other in the first direction D1 and the second direction D2. Sidewalls of the spacers 120, which face each other in the second direction D2, may be exposed by the second trench T2.

The first insulating patterns 114 may be spaced apart from each other in the first direction D1 and the second direction D2. For example, the first insulating patterns 114 arranged in the first direction D1 may be spaced apart from each other with the second insulating pattern 112, the spacer 120 and the bottom electrode BE interposed therebetween. The first insulating patterns 114 arranged in the second direction D2 may be spaced apart from each other with the second trench T2 interposed therebetween. Sidewalls of the first insulating patterns 114, which face each other in the second direction D2, may be exposed by the second trench T2. After the patterning process, the second mask patterns M2 may be removed.

Figure 8A:
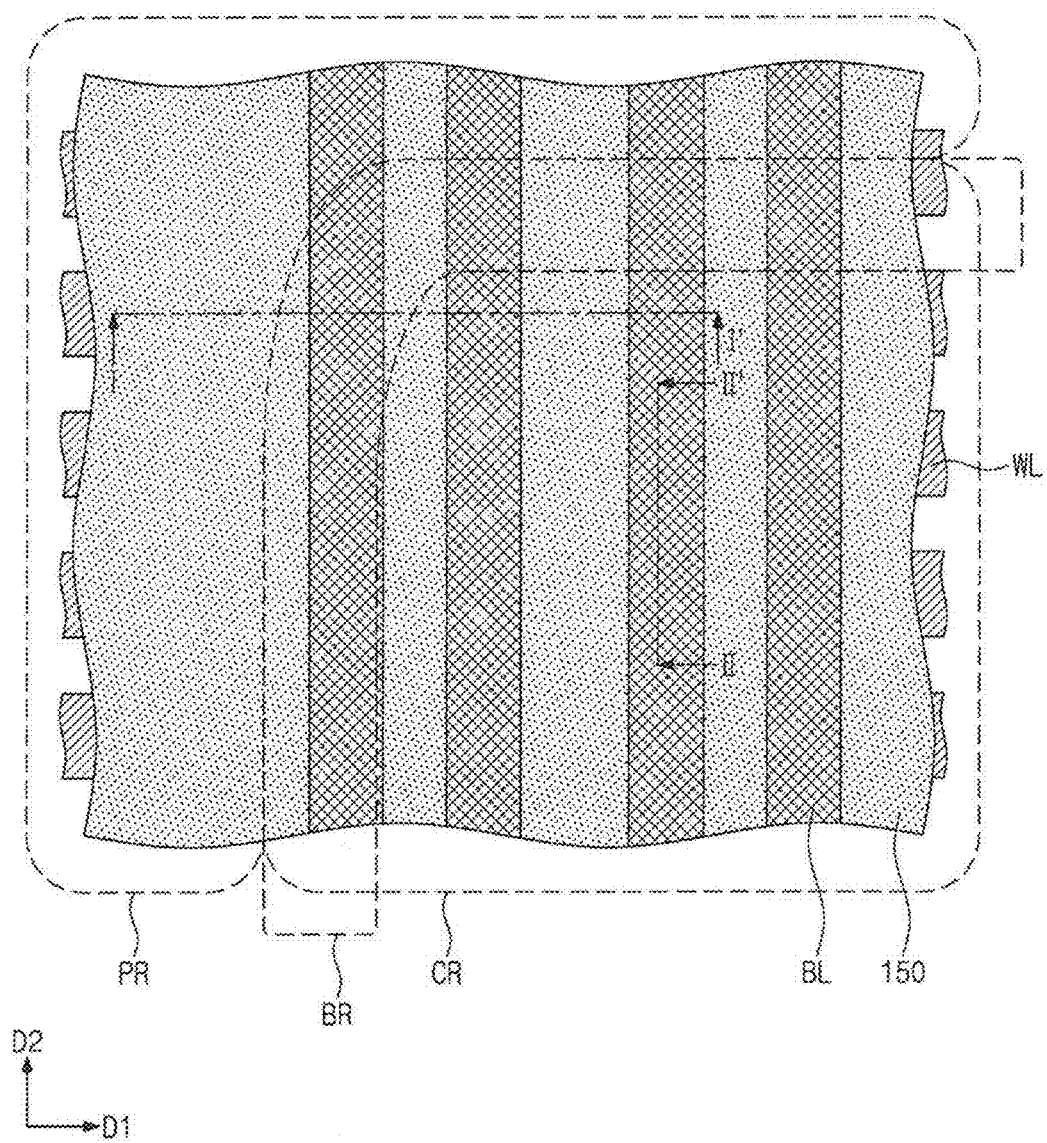
Figure 8B:
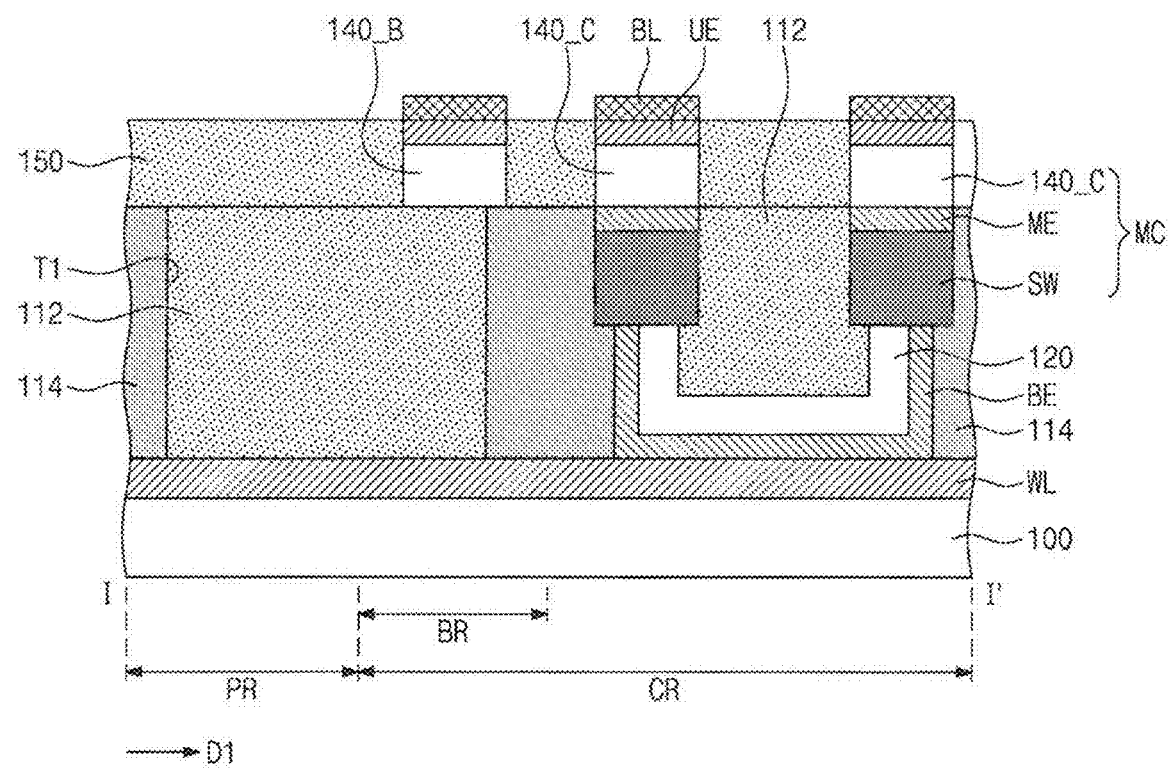
Figure 8C:
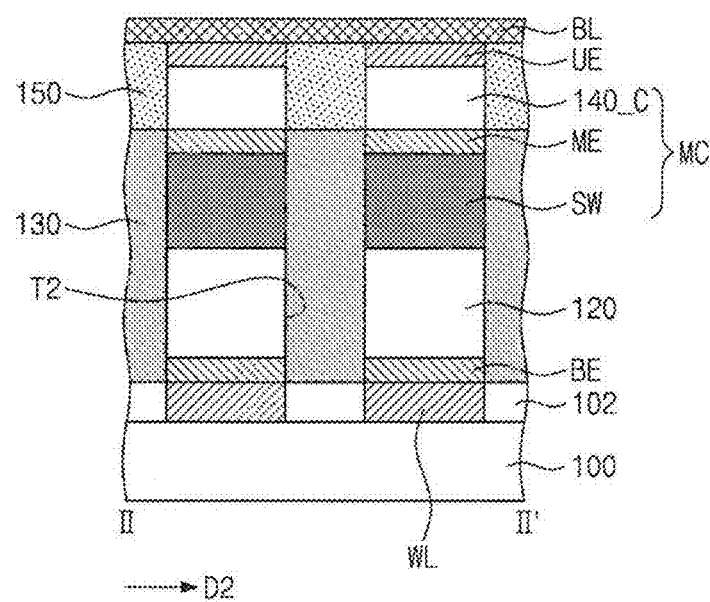

Referring to FIGS. 8A to 8C, memory cells MCs and bit lines BL may be formed on the bottom electrodes BE. The bit lines BL may extend in the second direction D2. In some embodiments, the memory cells MCs may be formed only on the cell region CR. Each of the memory cells MCs may include a switching element SW and a variable resistance structure 140_C connected in series between the word line WL and the bit BL. At this time, the switching element SW may not be formed on the boundary region BR, and the second insulating pattern 112 may be disposed between the word line WL and the variable resistance structure 140_B that is formed on the boundary region BR, as illustrated in FIG. 8B. The memory cells MCs may not be formed on the peripheral region PR. Switching elements SW and variable resistance structures 140_S and 140_B may not be formed on the peripheral region PR. It will be understood that the variable resistance structures 140 include the variable resistance structure 140_B on the boundary region B and the variable resistance structure 140_C on the cell region CR.

Referring to FIGS. 8B and 8C, in some embodiments, the variable resistance structure 140_B that is formed on the boundary region BR, may be directly adjacent the variable resistance structure 140_C that is formed on the cell region CR without any intervening variable resistance structures 140_B and 140_C. The variable resistance structure 140_B on the boundary region BR may overlap the word line WL and may be electrically insulated from the word line WL. The first insulating pattern 114 and the second insulating pattern 112 may be disposed between the variable resistance structure 140_B on the boundary region BR and the word line WL and may electrically insulate the variable resistance structure 140_B from the word line WL. A lower surface of the variable resistance structure 140_B, in some embodiments, an entirety of the lower surface of the variable resistance structure 140_B, may contact the first insulating patterns 114 and the second insulating pattern 112. A portion of the word line WL, that is overlapped by the variable resistance structure 140_B has an upper surface that faces the variable resistance structure 140_B and contacts the first insulating patterns 114 and the second insulating pattern 112.

The variable resistance structure 140_C on the cell region CR may overlap the word line WL, as illustrated in FIGS. 8B and 8C, and may be configured to be electrically connected to the word line WL through the switching element SW. Hereinafter, processes of forming the memory cells MCs and the bit lines B1, will be described in more detail.

A third insulating pattern 130 may be formed in the second trench T2. The third insulating pattern 130 may be formed of, for example, the same insulating material as the first insulating patterns 114 and the second insulating patterns 112. For example, the third insulating pattern 130 may include silicon nitride.

Upper portions of the bottom electrodes BE and upper portions of the spacers 120 may be etched, in some embodiments, sequentially etched. Thus, top surfaces of the bottom electrodes BE and top surfaces of the spacers 120 may be recessed from top surfaces of the first to third insulating patterns 114, 112 and 130, and thus inner spaces surrounded by the first to third insulating patterns 114, 112 and 130 may be formed on the bottom electrodes BE and the spacers 120. In some embodiments, an etching process for increasing widths of the inner spaces may be performed.

The switching element SW and an intermediate electrode ME may be sequentially formed in each of the inner spaces. The switching elements SW may fill lower regions of the inner spaces. The intermediate electrodes ME may be formed on top surfaces of the switching elements SW to fill upper regions, of the inner spaces. At this time, the switching elements SW may not be formed on the boundary region BR. In more detail, since the inner spaces, in which the switching elements SW are formed, are formed by sequentially etching the bottom electrodes BE and the spacers 120, the inner spaces may not be formed on the boundary region BR from which the bottom electrodes BE and the spacers 120 were already removed.

In some embodiments, the switching elements SW may be formed of a compound that includes at least one of Te or Se (i.e., chalcogenide elements) and at least one of Ge, Sb, Bi, Al, Pb, Sn, Ag, As, S, Si, In, Ti, Ga, or P. The switching elements SW may further include a thermal stabilization element. The thermal stabilization element may include at least one of C, N, or O. For example, the switching elements SW may include AsTe, AsSe, GeTe, SnTe, GeSe, SnTe, SnSe,Te, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe. The switching elements SW may have a stronger adhesive strength with an insulating material (e.g., the second insulating pattern 112) than with a metal material (e.g., the bottom electrode BE).

The intermediate electrodes ME may be formed on the switching elements SW, respectively. The intermediate electrodes ME may be formed to fill remaining regions of the inner spaces, which are not filled with the switching elements SW. The intermediate electrodes ME may include a conductive material such as W, Ti, Al, Cu, C, CN, TiN, TiAlN, TISiN, TiCN, WN, CoSiN, WSiN, TaN, TaCN, TaSiN, and/or TiO.

A second interlayer insulating layer 150 may be formed on the first to third insulating patterns 114, 112 and 130. The second interlayer insulating layer 150 may include openings (e.g., holes disposed on the cell region CR. The openings may expose top surfaces of the intermediate electrodes ME, respectively. The second interlayer insulating layer 150 may include an insulating material such as silicon nitride.

One of the variable resistance structures 140_13 and 140_C and one of top electrodes UE may be sequentially formed in each of the openings. The variable resistance structures 140_13 and 140_C may fill lower regions of the openings, and the top, electrodes UE may be formed on top surfaces of the variable resistance structures 140_B and 140_C to fill upper regions of the openings. At this time, the variable resistance structures 140_B and 140_C and the top electrodes UE may be formed on the cell region CR including the boundary region BR but may not be formed on the peripheral region PR. In some embodiments, the openings in which the variable resistance structures 140_B and 140_C and the top electrodes UE are formed may not be formed on the peripheral region PR.

In some embodiments, the variable resistance structures 140_B and 140_C may include a phase change material. The phase change material may be formed of a compound that includes at least one of Te or Se (i.e., chalcogenide elements) and at least one of Ge, Sb, Bi, Pb, Sn, Ag, As, S, Si, In, Ti, Ga, P, O, or C. For example, the phase change material may include GeSbTe, GeTeAs, SbTeSe, GeTe, SbTe, SeTeSn, GeTeSe, SbSeBi, GeBiTe, GeTeTi, InSe, GaTeSe, or InSbTe. In some embodiments, the phase change material may include a perovskite compound or a conductive metal oxide. For example, the phase change material may include niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, or barium-strontium-zirconium oxide. When the variable resistance structures 140_B and 140_C include a transition metal oxide, a dielectric constant of the variable resistance structures 140_B and 140_C may be greater than a dielectric constant of silicon oxide. In some embodiments, the variable resistance structures 140_B and 140_C may have a double-layer structure of a conductive metal oxide layer and a tunnel insulating layer or may have a triple-layer structure of a first conductive metal oxide layer, a tunnel insulating layer and a second conductive metal oxide layer. The tunnel insulating layer may include, for example, aluminum oxide, hafnium oxide, and/or silicon oxide. The variable resistance structures 140_B and 140_C may have a stronger adhesive strength with an insulating material (e.g., the second insulating pattern 112) than with a metal material (e.g., the bottom electrode BE).

The top electrodes UE may include a conductive material such as W, Ti, Al, Cu, C, CN, TiN, TiAlN, TiSiN, TiCN, WN, CoSiN, WSiN, TaN, TaCN, TaSiN, and/or TiO.

The bit lines BL may be formed on the top electrodes UE. The bit lines BL may extend in the second direction D2 and traverse the word lines WL. Each of the bit lines BL may be electrically connected to the top electrodes UE arranged in the second direction D2. For example, the bit lines BL may include at least one of a metal material (e.g., copper or aluminum) and/or a conductive metal nitride material (e.g., TiN or WN).

Even though not shown in the drawings, a conductive circuit may be formed on the peripheral region PR. For example, transistors for driving a semiconductor memory device (e.g., the memory cells) may be formed on the peripheral region PR. Processes of forming the conductive circuit may include an etching process. The memory cells on the cell region CR adjacent to the peripheral region PR may be damaged by the etching process, or portions of the memory cells may be etched by the etching process and the other portions of the memory cells may remain after the etching process.

If the bottom electrode BE on the boundary region BR is not removed, some damaged memory cells (e.g., damaged variable resistance structures 140_B) of the cell region CR may be electrically connected to the word lines WL. When power is applied to the damaged memory cells, a leakage current may flow through the damaged memory cells.

However, according to some embodiments of the inventive concepts, at least one of the bottom electrode BE and the switching element SW may not be formed on the cell region CR (i.e., the boundary region BR) adjacent to the peripheral region PR. Thus, the memory cells damaged during the etching process of the peripheral region PR may be electrically insulated from the word lines WL. The variable resistance memory device formed according to some embodiments of the inventive concepts may reduce or possibly inhibit a leakage current through damaged memory cells adjacent to a boundary between the cell region CR and the peripheral region PR.

In addition, the variable resistance structure 140_B may be in direct contact with the second insulating pattern 112 on the boundary region BR. The variable resistance structure 140_B may have a stronger adhesive strength with an insulating material (e.g., the second insulating pattern 112) than with a conductive material (e.g., the bottom electrode BE). Thus, it is possible to improve interlayer adhesive strength and structural stability of the variable resistance memory device formed according to some embodiments of the inventive concepts.

In the memory cell, according to some embodiments described above, the variable resistance structure 140_C is disposed on the switching element SW. In some embodiments, the positions of the switching element SW and the variable resistance structure 140_C may be reversed. In other words, the variable resistance structure 140_C may be formed on the bottom electrode BE, the intermediate electrode ME may be formed on the variable resistance structure 140_C, and the switching element SW may be formed between the intermediate electrode ME and the top electrode UE.

In some embodiments, a portion of the conductive layer 106 and a portion of the spacer layer 108 may remain on the boundary region BR.

FIGS. 9A to 13A are plan views illustrating a method of forming a variable resistance memory device according to some embodiments of the inventive concepts. FIGS. 9B to 13B are cross-sectional views taken along the lines I-I' of FIGS. 9A to 13A, respectively. FIGS. 9C to 13C are cross-sectional views taken along the lines II-II' of FIGS. 9A to 13A, respectively.

Figure 9A:
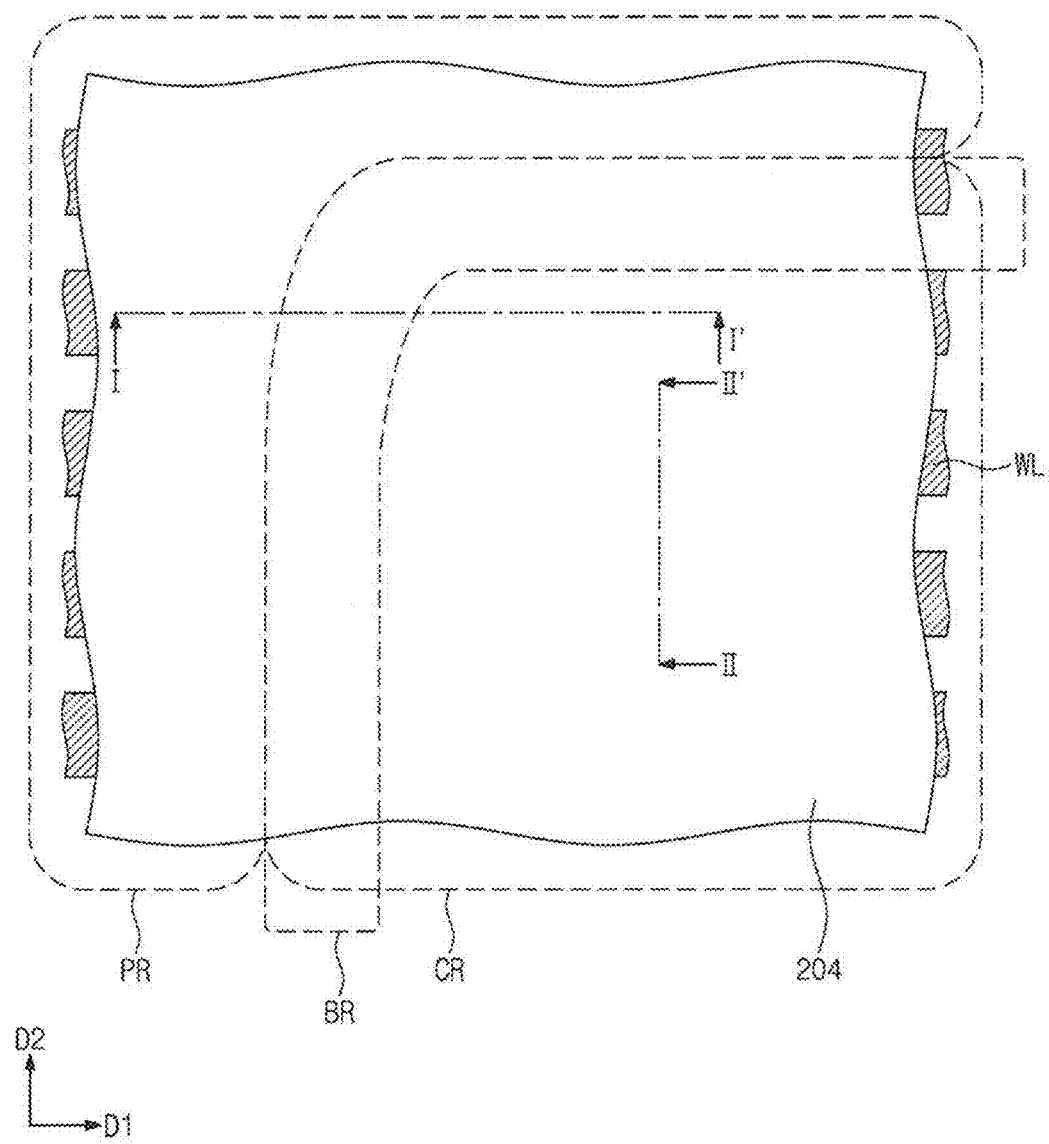
FIGS. 9A, 10A, 11A, 12A, and 13A are plan views illustrating a method of forming a variable resistance memory device according to some embodiments of the inventive concepts.
Figure 9B:
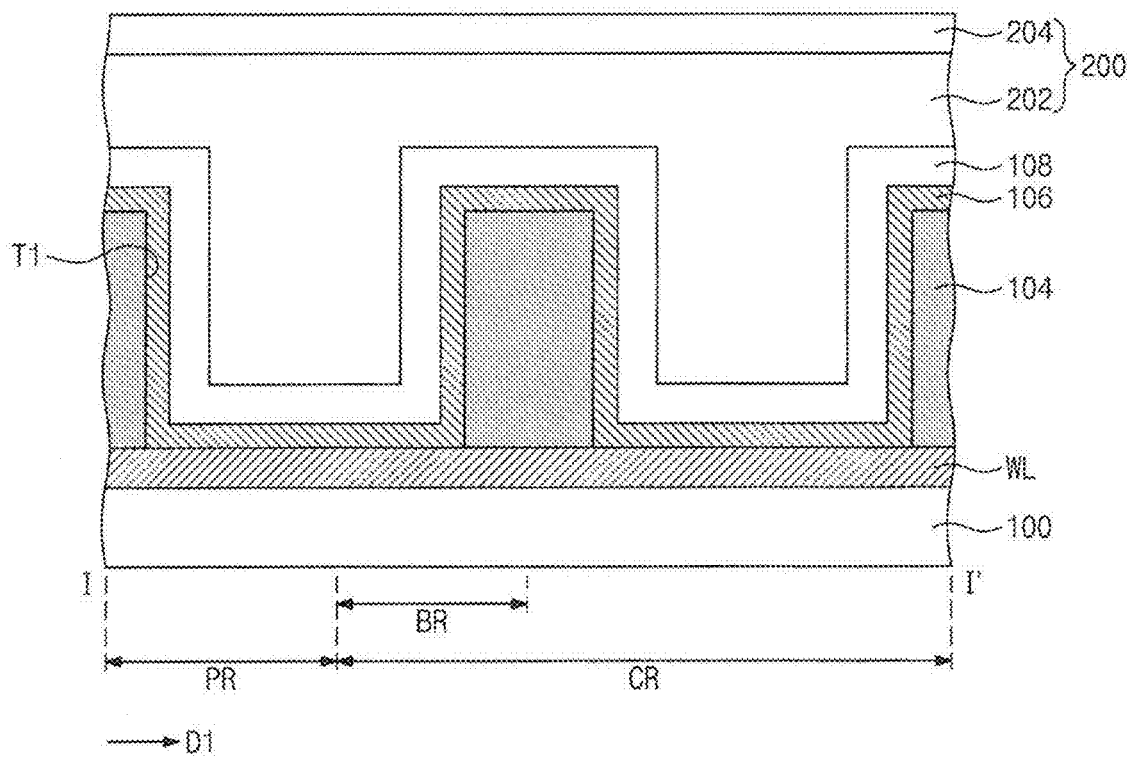
FIGS. 9B, 10B, 11B, 12B, and 13B are cross-sectional views taken along the lines I-I' of FIGS. 9A to 13A, respectively.
Figure 9C:
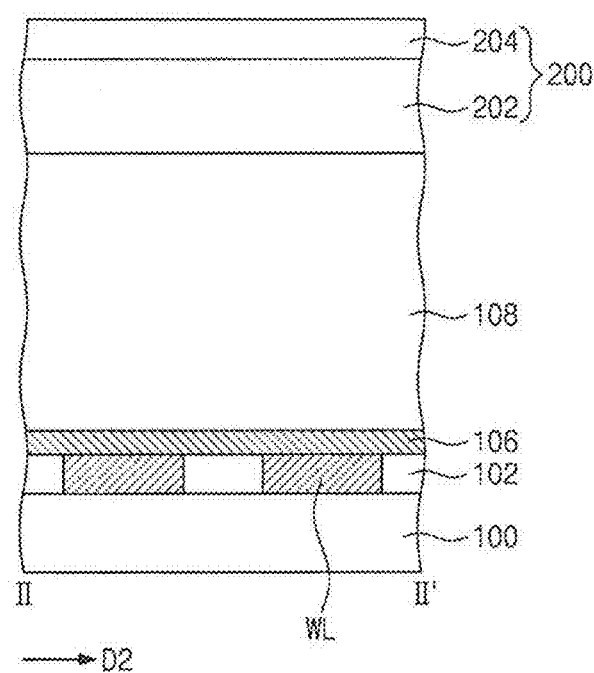
FIGS. 9C, 10C, 11C, 12C, and 13C are cross-sectional views taken along the lines II-II' of FIGS. 9A to 13A, respectively.

Referring to FIGS. 9A to 9C, a sacrificial layer 200 may be formed on the resultant structure described with reference to FIGS. 3A to 3C. The sacrificial layer 200 may include, for example, a spin-on-hard mask (SOH) layer. For example, the sacrificial layer 200 may include a first, sacrificial layer 202 including a carbon-based hard mask material and a second sacrificial layer 204 including a silicon-based hard mask material. In some embodiments, the first sacrificial layer 202 may fully fill the first trench T1. The second sacrificial layer 204 may be formed on the first sacrificial layer 202.

Figure 10A:
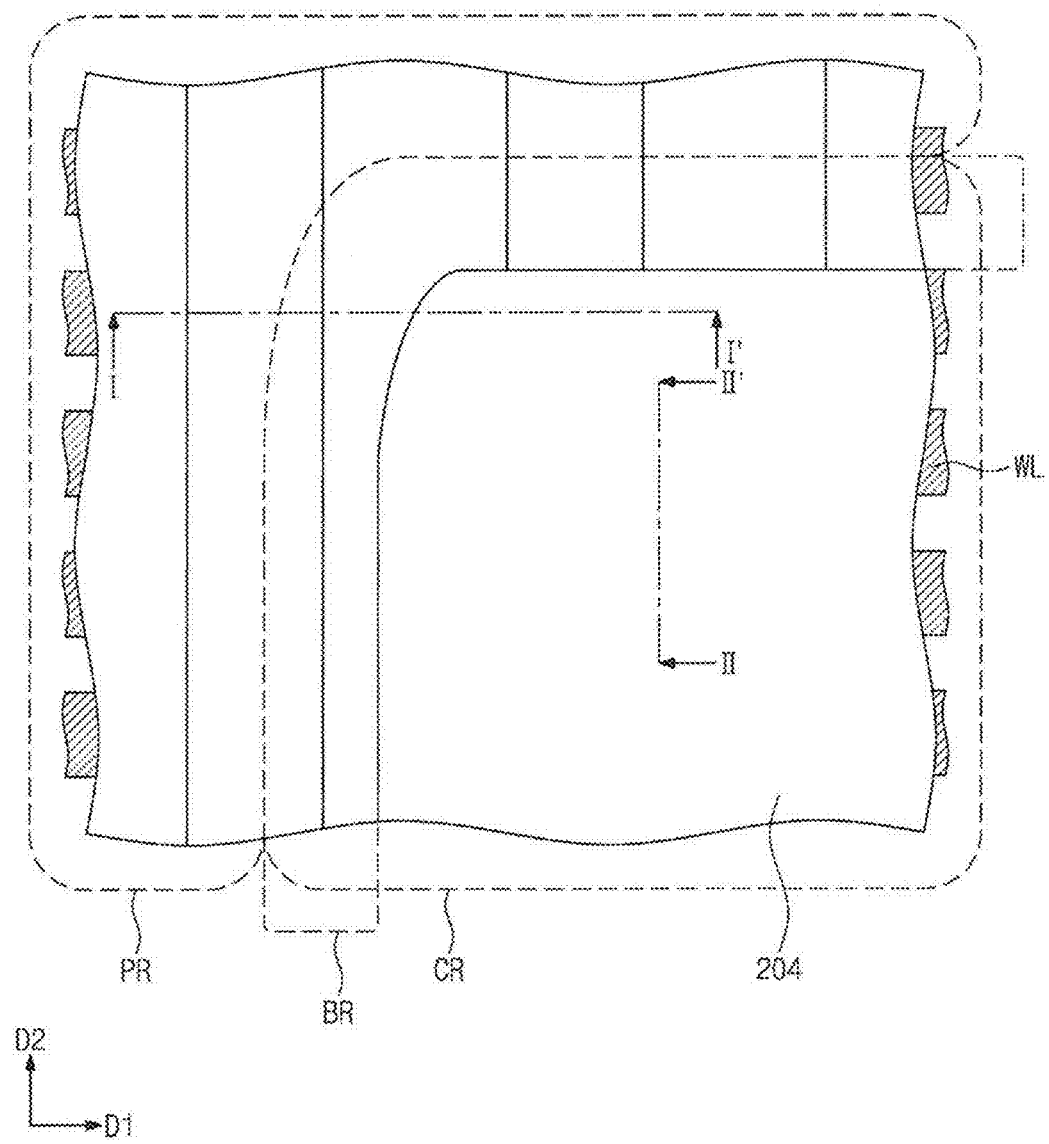
Figure 10B:
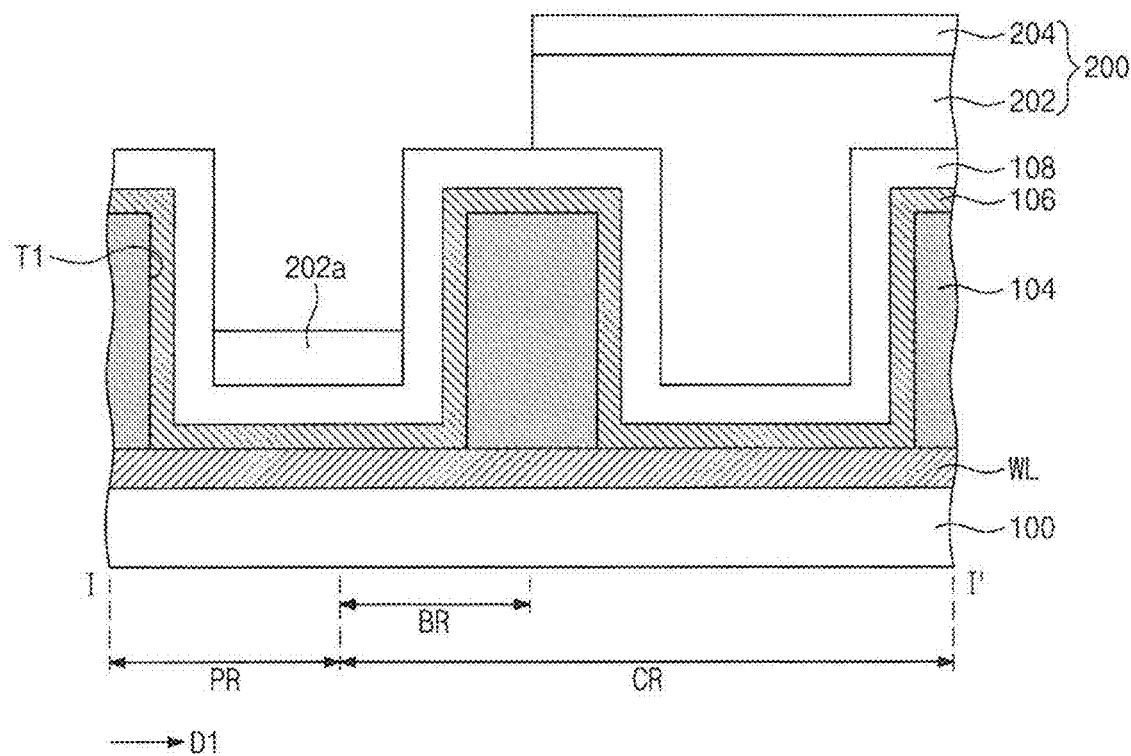
Figure 10C:
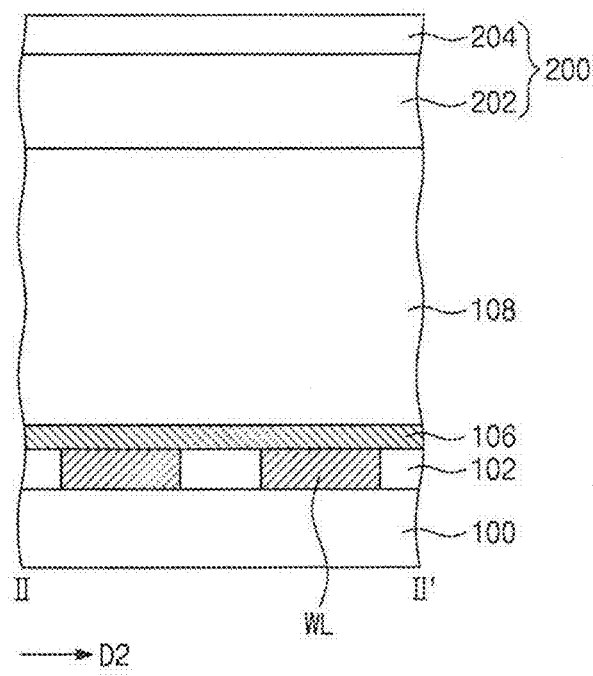

Referring to FIGS. 10A to 10C, the sacrificial layer 200 may be patterned. The patterned sacrificial layer 200 may cover the cell region CR but may expose the boundary region BR. For example, the second sacrificial layer 204 may be patterned, and the first sacrificial layer 202 may be then etched using the patterned second sacrificial layer 204 as an etch mask. At this time, the first sacrificial layer 202 on the boundary region BR may not be completely removed but may partially remain in the first trench T1. In other words, a remaining portion 202a of the first sacrificial layer 202 may remain in a lower region of the first trench T1 on the boundary region BR. A height of a top surface of the remaining portion 202a of the first sacrificial layer 202 may be lower than a height of the top surface of the first insulating layer 104, as illustrated in FIG. 10B. A lower portion of the spacer layer 108 in the first trench T1 on the boundary region BR may not be exposed by the remaining portion 202a of the first sacrificial layer 202.

Figure 11A:
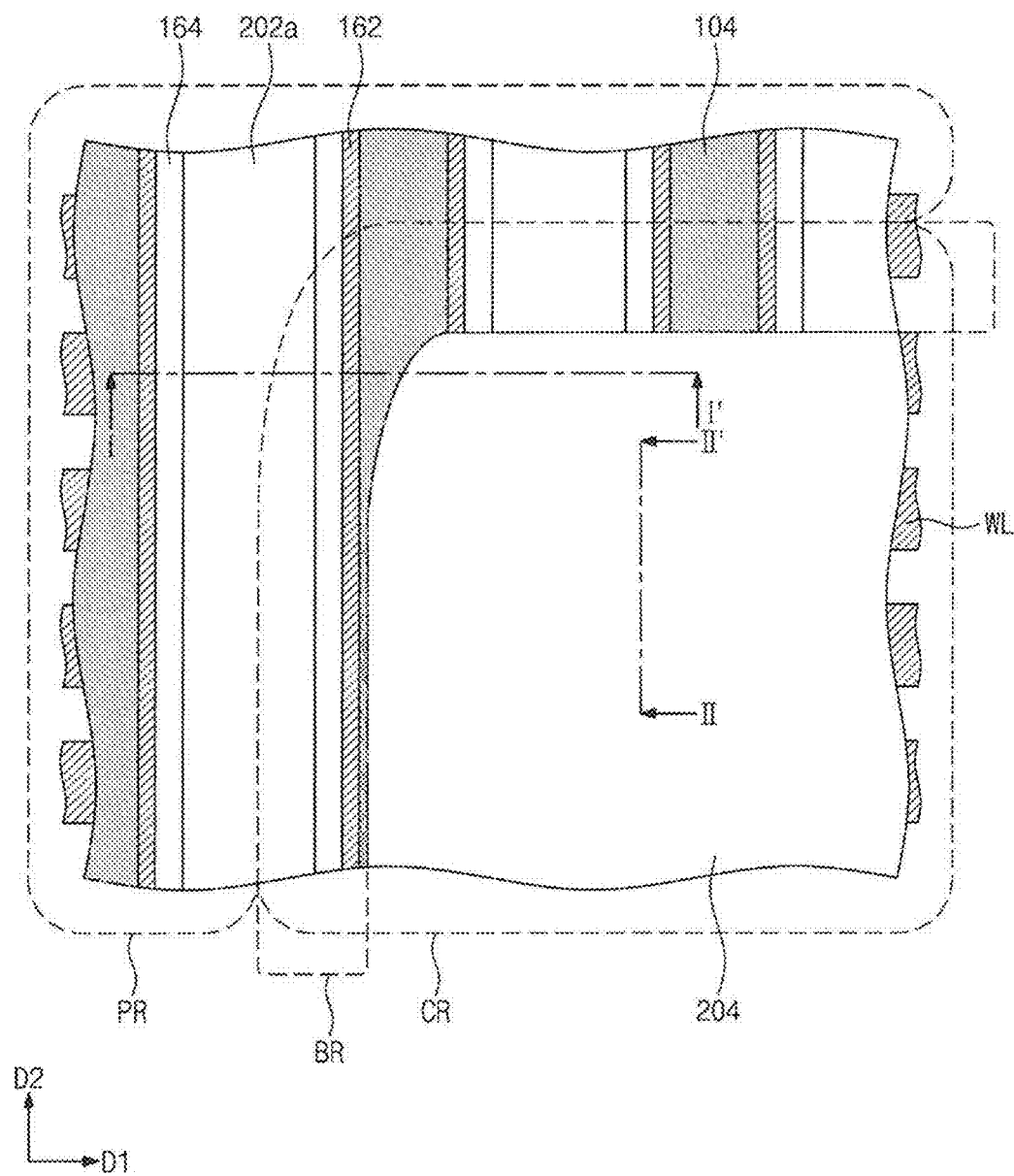
Figure 11B:
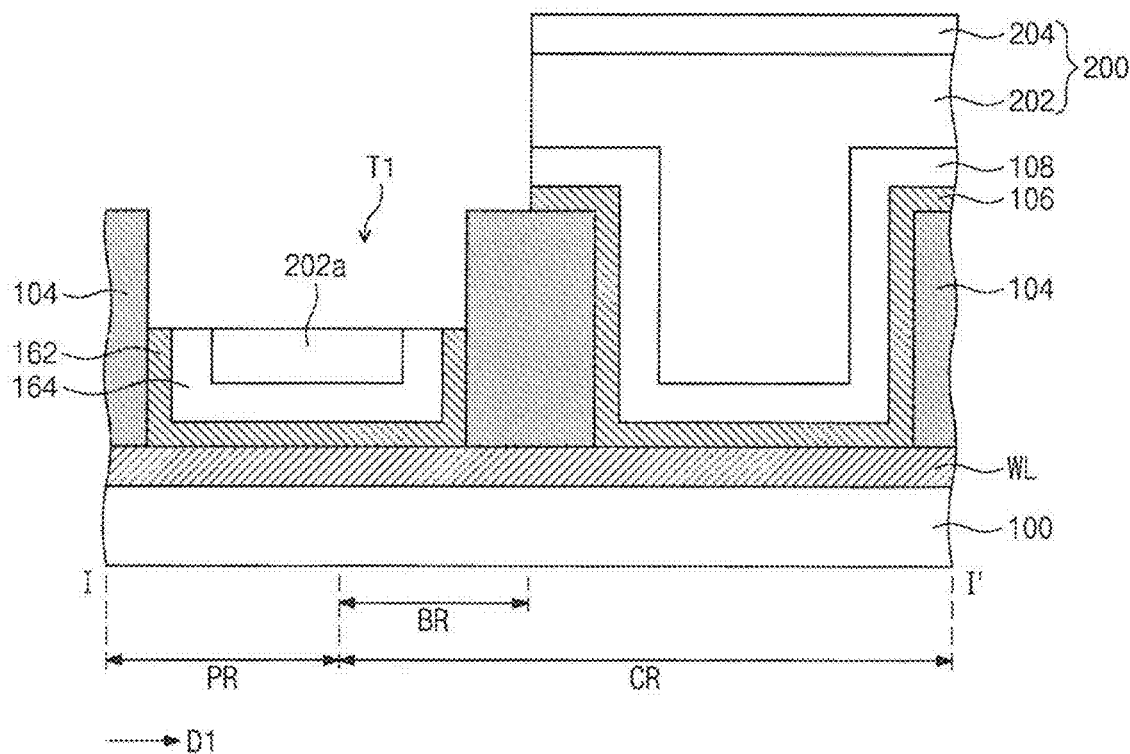
Figure 11C:
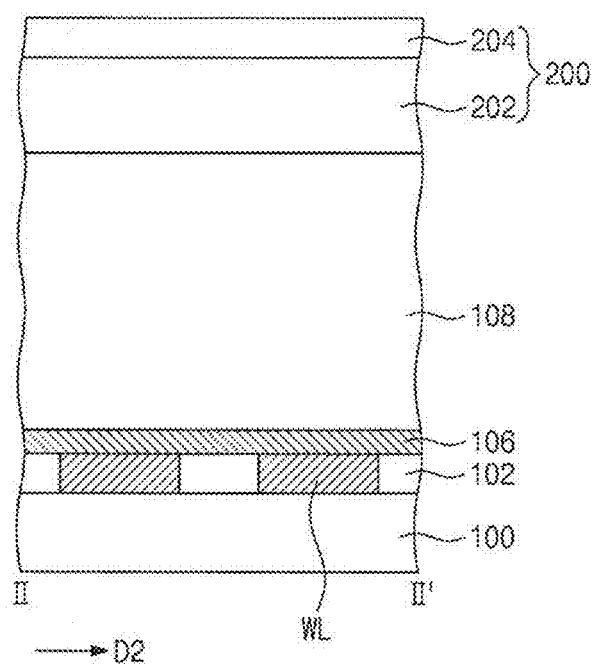

Referring to FIGS. 11A to 11C, the conductive layer 106 and the spacer layer 108 may be etched. For example, an etching process may be performed on the spacer layer 108 and the conductive layer 106 by using the sacrificial layer 200 and the remaining portion 202a of the first sacrificial layer 202 as etch masks. On the boundary region BR, a portion of the conductive layer 106 may be removed to form a first portion 162 and a portion of the spacer layer 108 may be removed to form a second portion 164. A sidewall of the first trench T1 on the boundary region BR may be exposed by the etching process. At this time, the conductive layer 106 and the spacer layer 108 on the peripheral region PR may also be etched.

Figure 12A:
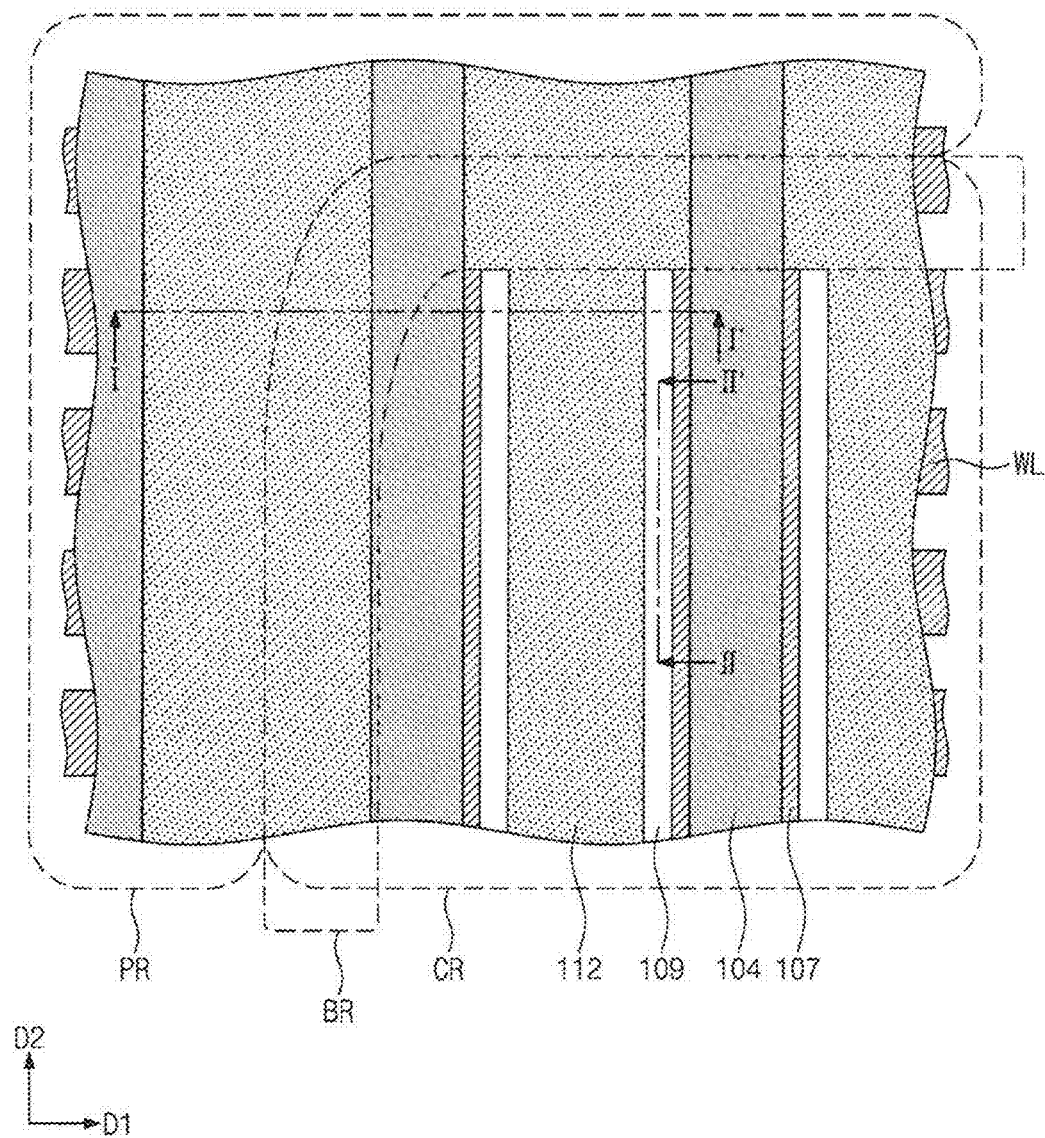
Figure 12B:
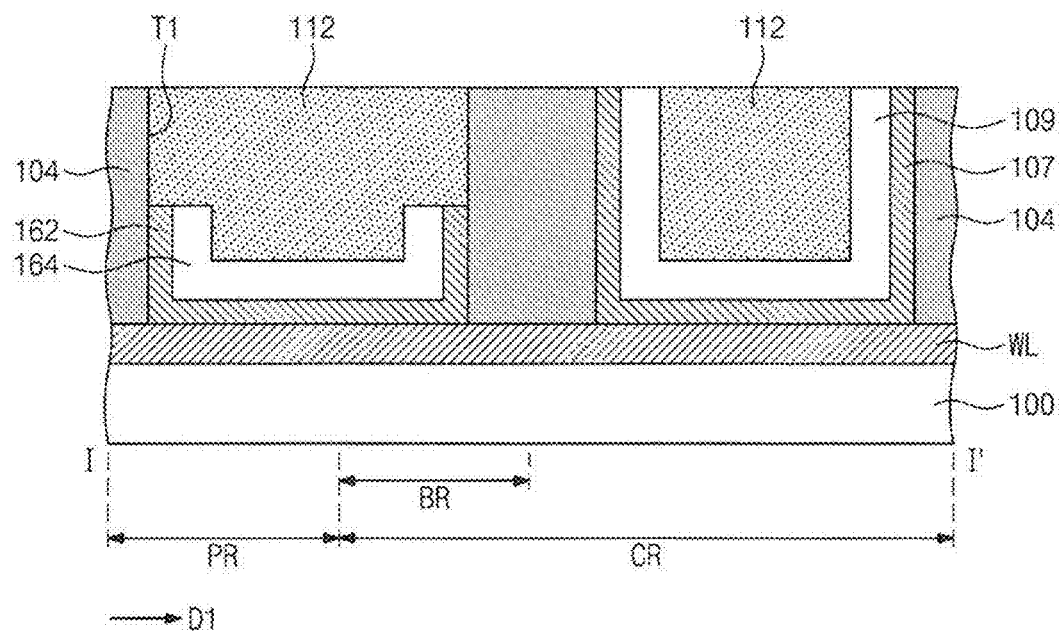
Figure 12C:
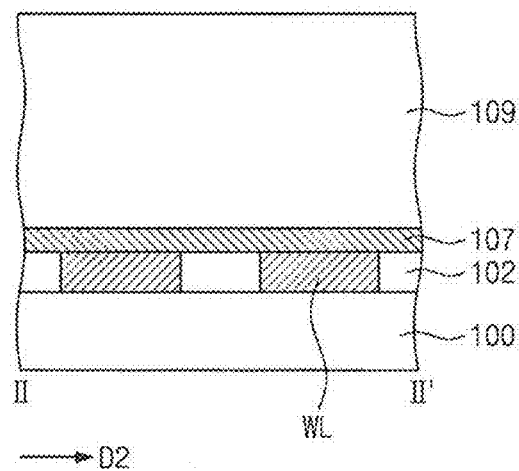

Referring to FIGS. 12A to 12C, a second insulating pattern 112 may be formed in the first trench T1 after removing the sacrificial layer 200 and the remaining portion 202a of the first sacrificial layer 202. In more detail, a second insulating layer may be formed on the spacer layer 108 to fill a remaining region of the first trench T1. Thereafter, a planarization process may be performed on the second insulating layer, the spacer layer 108 and the conductive layer 106 until the top surface of the first insulating layer 104 is exposed, thereby forming an electrode pattern 107, a spacer pattern 109 and the second insulating pattern 112 which are sequentially stacked in the first trench T1. At this time, the second insulating pattern 112 may cover the first portion 162 and the second portion 164 in the first trench T1 on the boundary region BR. In other words, the first portion 162 and the second portion 164 may be surrounded by the first insulating layer 104 and the second insulating pattern 112 and may not be exposed.

Figure 13A:
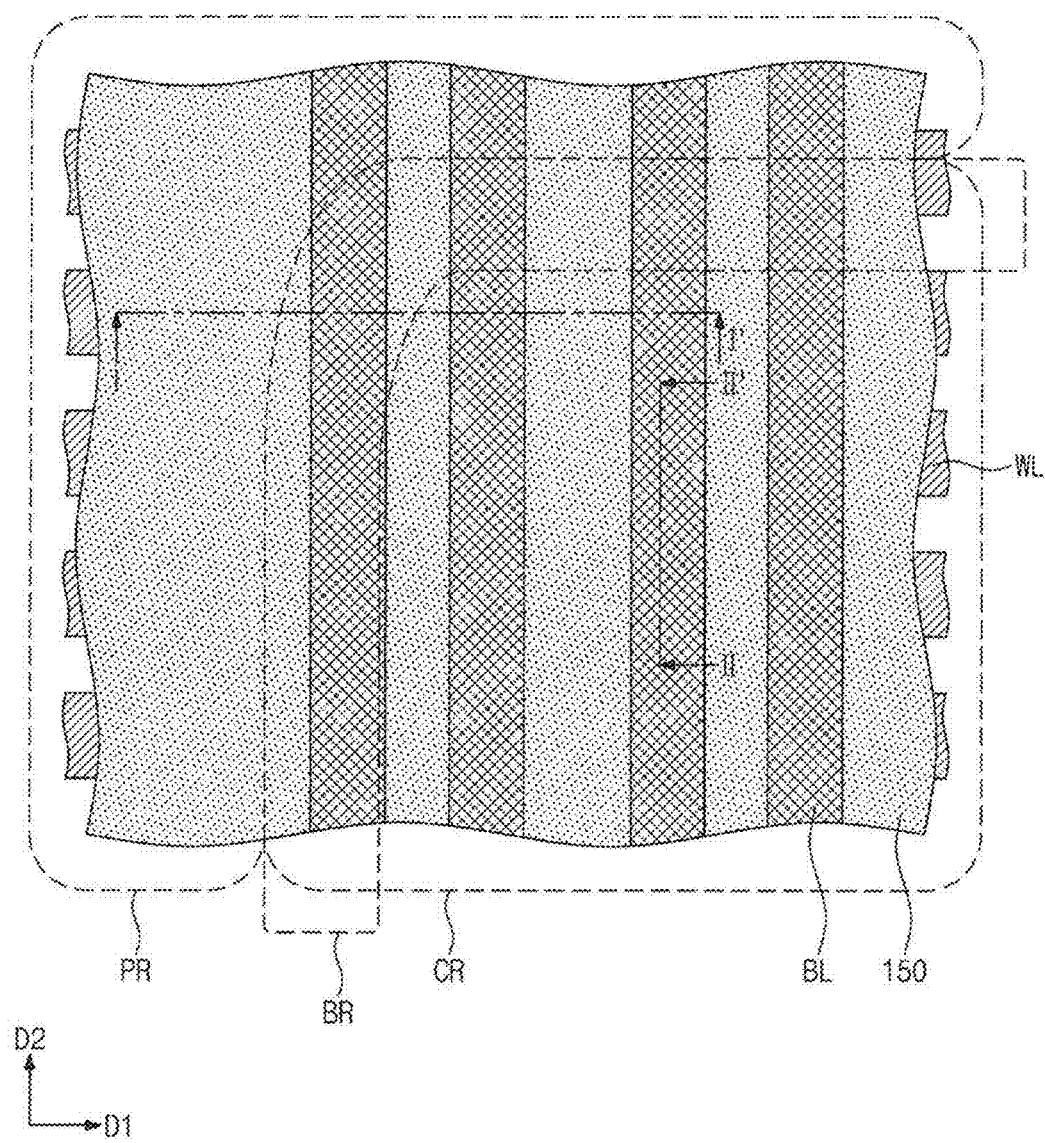
Figure 13B:
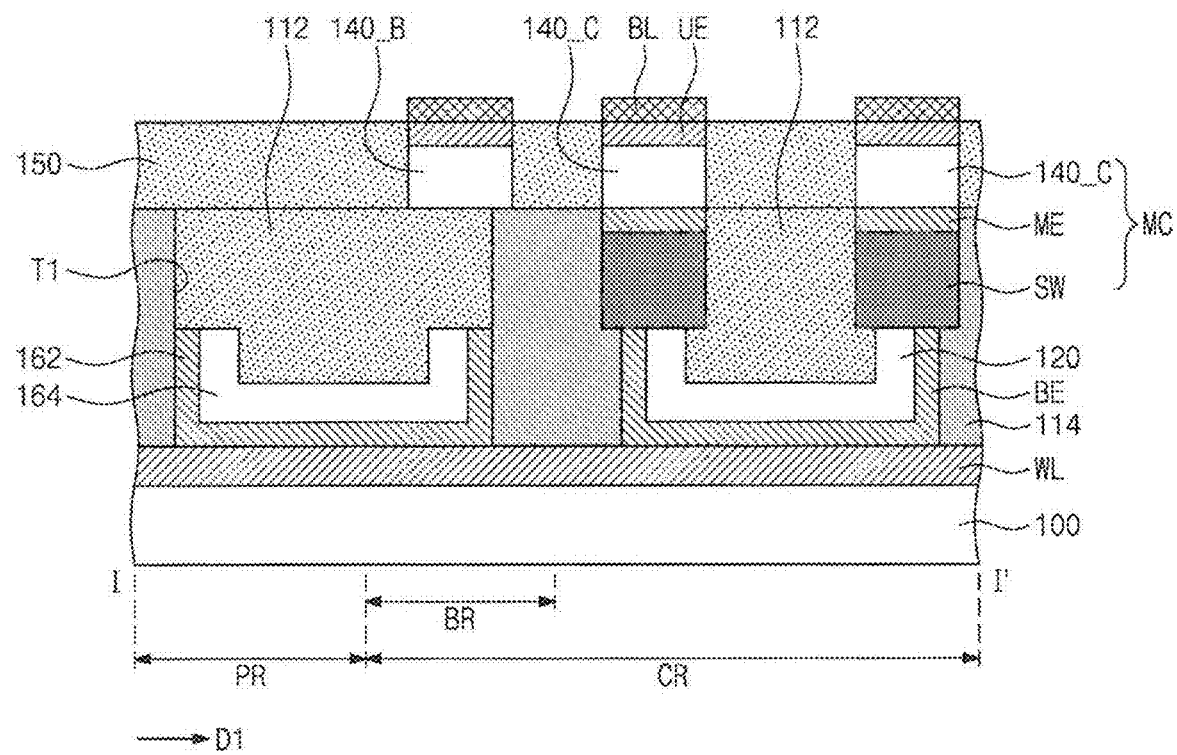
Figure 13C:
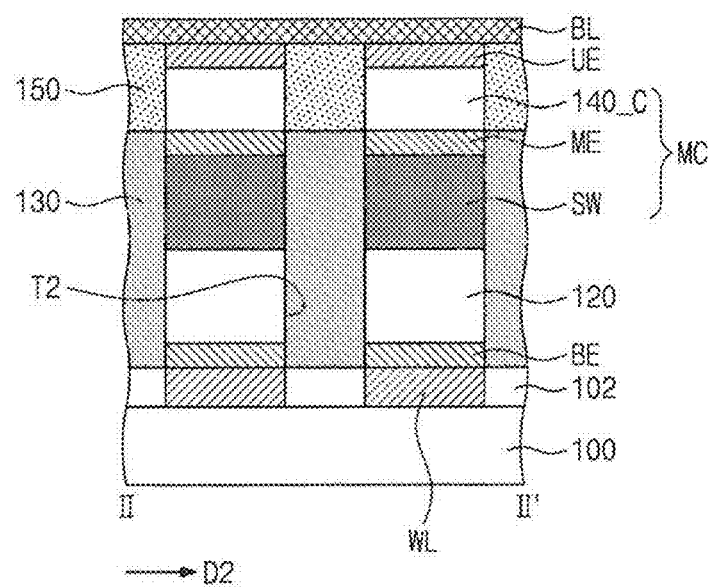

Referring to FIGS. 13A to 13C, second trenches T2 may be formed to form bottom electrodes BE, spacers 120, and first insulating patterns 114, as described with reference to FIGS. 7A to 7C. Third insulating patterns 130 may be formed in each of the second trenches T2. Memory cells and bit lines BL may be formed on the bottom electrodes BE. Upper portions of the bottom electrodes BE and upper portions of the spacers 120 may be sequentially etched. Thus, inner spaces surrounded by the first to third insulating patterns 114, 112 and 130 may be formed on the bottom electrodes BE and the spacers 120. A switching element SW and an intermediate electrode ME may be sequentially formed in each of the inner spaces. At this time, the switching elements SW may not be formed on the boundary region BR. A variable resistance structure 140_C and a top electrode UE may be sequentially formed on each of the intermediate electrodes ME on the cell region CR, and a variable resistance structure 140_B and a top electrode UE may be sequentially formed on the first insulating patterns 114 and, the second insulating pattern 112. In some embodiments, one of the variable resistance structures 140_B and 140_C and one of the top electrodes UE may be sequentially formed in each of openings (e.g., holes) of the second interlayer insulating layer 150. At this time, the variable resistance structures 140_B and 140_C and the top electrodes UE may not be formed on the peripheral region PR.

The variable resistance structure 140_B that is on boundary region BR and overlaps the first and second portions 162 and 164 may be insulated from the first and second portions 162 and 164. In some embodiments, the first and second portions 162 and 164 may be spaced apart from the variable resistance structure 140_B that overlaps the first and second portions 162 and 164, and the first insulating patterns 114 and the second insulating pattern 112 may be between the first and second portions 162 and 164 and the variable resistance structure 140_B as illustrated in FIG. 13B. Upper surfaces of the first and second portions 162 and 164, in some embodiments, entireties of the upper surfaces of the first and second portions 162 and 164, that face the variable resistance structure 140_B may contact the second insulating pattern 112.

In some embodiments, a portion of the first sacrificial layer 202 remains in the first trench T1 after the etching process of the sacrificial layer 200. In some embodiments, the first sacrificial layer 202 may be completely removed from the boundary region BR. In this case, the sacrificial layer 200 may act as the first mask pattern M1 of FIGS. 4A to 4C.

In some embodiments, the process of removing a portion of the conductive layer 106 and a portion of the spacer layer 108 may be performed after the formation of the second trench T2.

FIGS. 14A to 19A are plan views illustrating a method of forming a variable resistance memory device according to some embodiments of the inventive concepts. FIGS. 14B to 19B are cross-sectional views taken along the lines I-I' of FIGS. 14A to 19A, respectively. FIGS. 14C to 19C are cross-sectional views taken along the lines II-II' of FIGS. 14A to 19A, respectively.

Figure 14A:
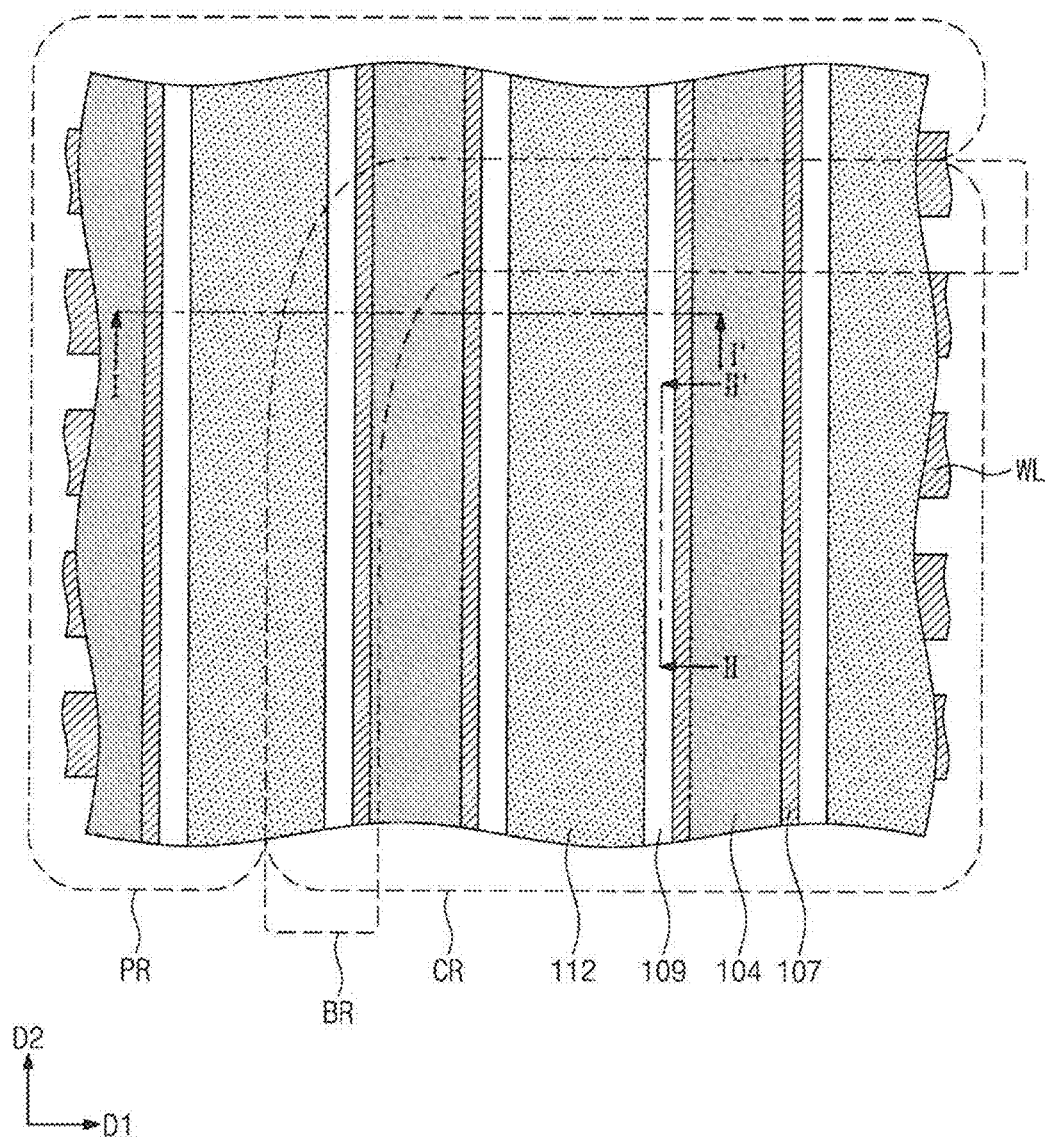
FIGS. 14A, 15A, 16A, 17A, 18A, and 19A are plan views illustrating a method of forming a variable resistance memory device according to some embodiments of the inventive concepts.
Figure 14B:
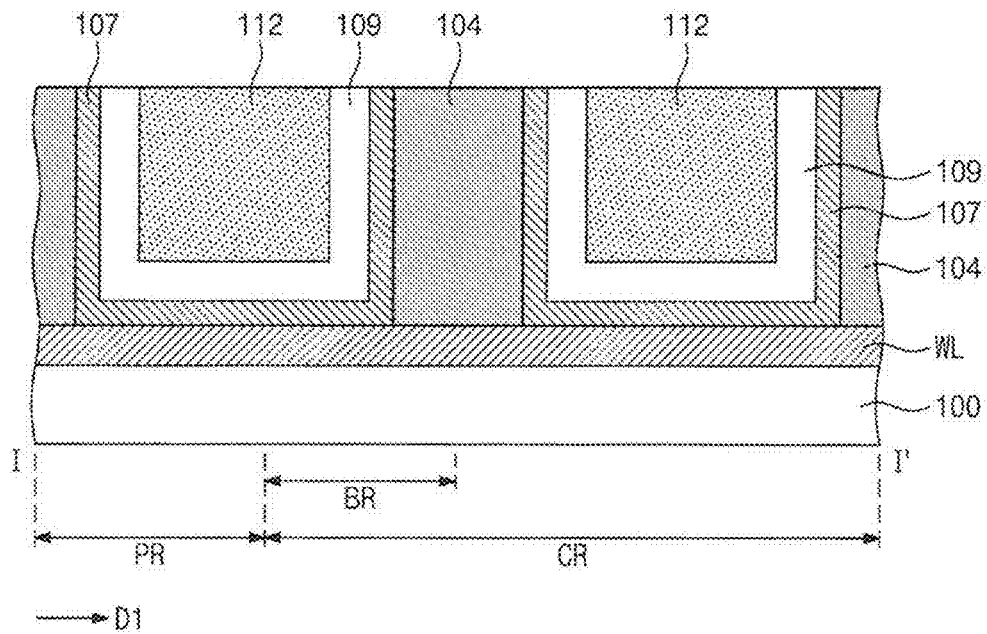
FIGS. 14B, 15B 16B, 17B, 18B, and 19B are cross-sectional views taken along the lines I-I' of FIGS. 14A to 19A, respectively.
Figure 14C:
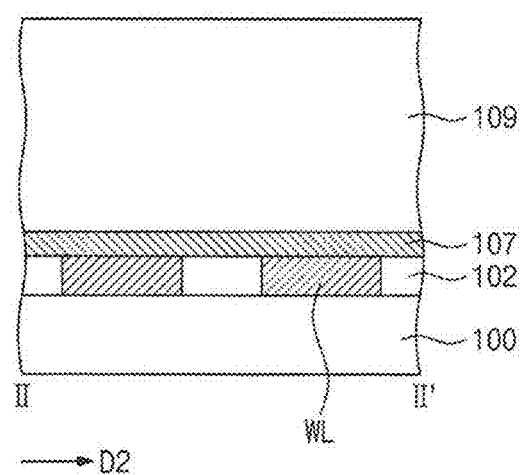
FIGS. 14C, 15C, 16C, 17C, 18C, and 19C are cross-sectional views taken along the lines II-II' of FIGS. 14A to 19A, respectively.

Referring to FIGS. 14A to 14C, a second insulating layer may be formed on the resultant structure of FIGS. 3A to 3C to fill the first trench T1. Thereafter, a planarization process may be performed on the second insulating layer, the spacer layer 108 and the conductive layer 106 until, the top surface of the first insulating layer 104 is exposed, thereby forming an electrode pattern 107, a spacer pattern 109 and a second insulating pattern 112 which are sequentially stacked in the first trench T1. The electrode pattern 107, the spacer pattern 109, the first insulating layer 104, and, the second insulating pattern 112 may extend in the second direction D2.

The electrode pattern 107 may include a conductive material. The spacer pattern 109 may include an insulating material having an etch selectivity with respect to the first interlayer insulating layer 102 and the first insulating layer 104. In some embodiments, the spacer pattern 109 may include a conductive material having an etch selectivity with respect to the first interlayer insulating layer 102 and the first insulating layer 104. The second insulating pattern 112 may include an insulating material having an etch selectivity with respect to the spacer pattern 109.

Figure 15A:
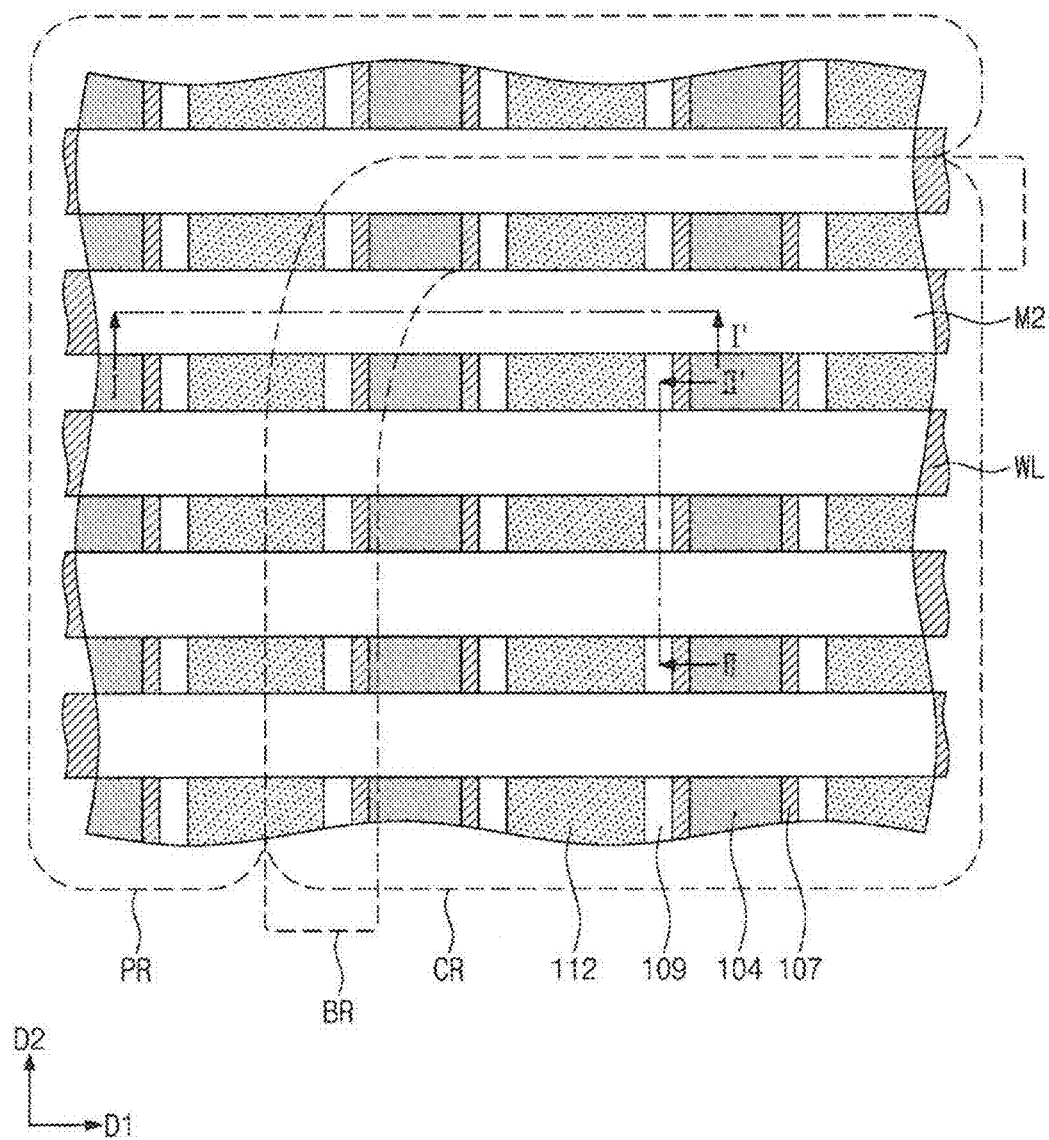
Figure 15B:
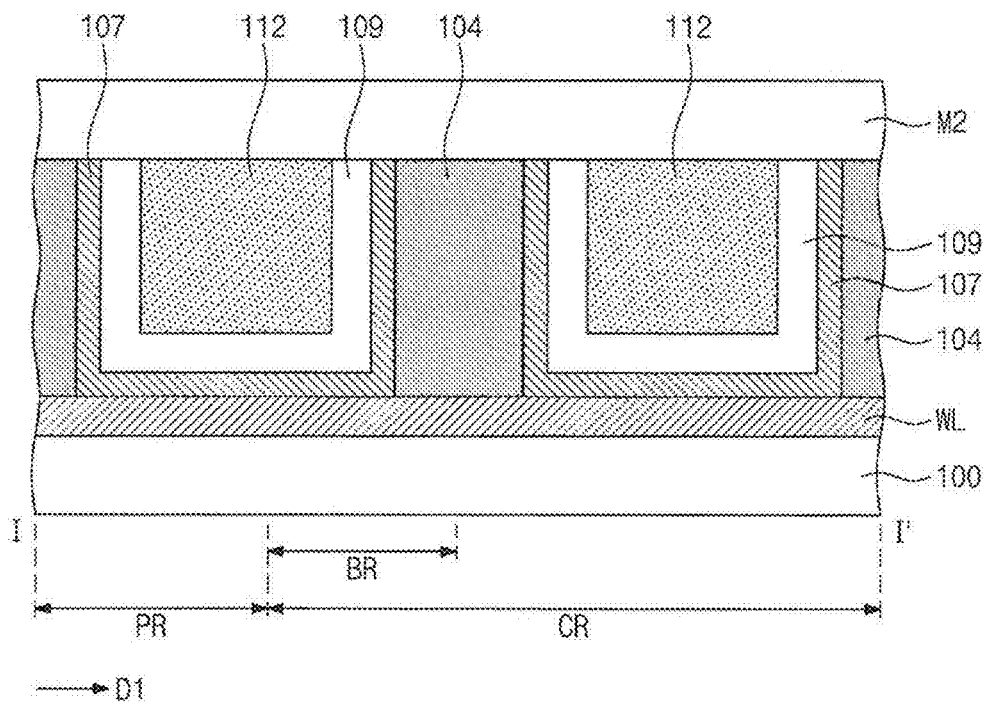
Figure 15C:
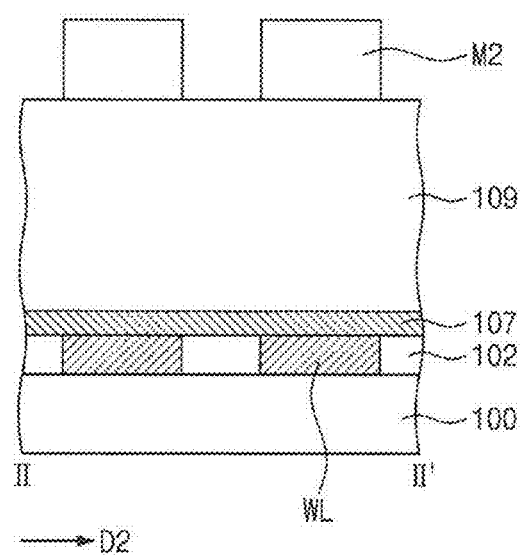

Referring to FIGS. 15A to 15C, second mask patterns M2 may be formed on the first insulating layer 104 and the second insulating pattern 112. The second mask patterns M2 may extend in the first direction D1 and may be parallel to each other. The second mask patterns M2 may expose portions of the electrode pattern 107, the spacer pattern 109, the second insulating pattern 112 and the first insulating layer 104.

Figure 16A:
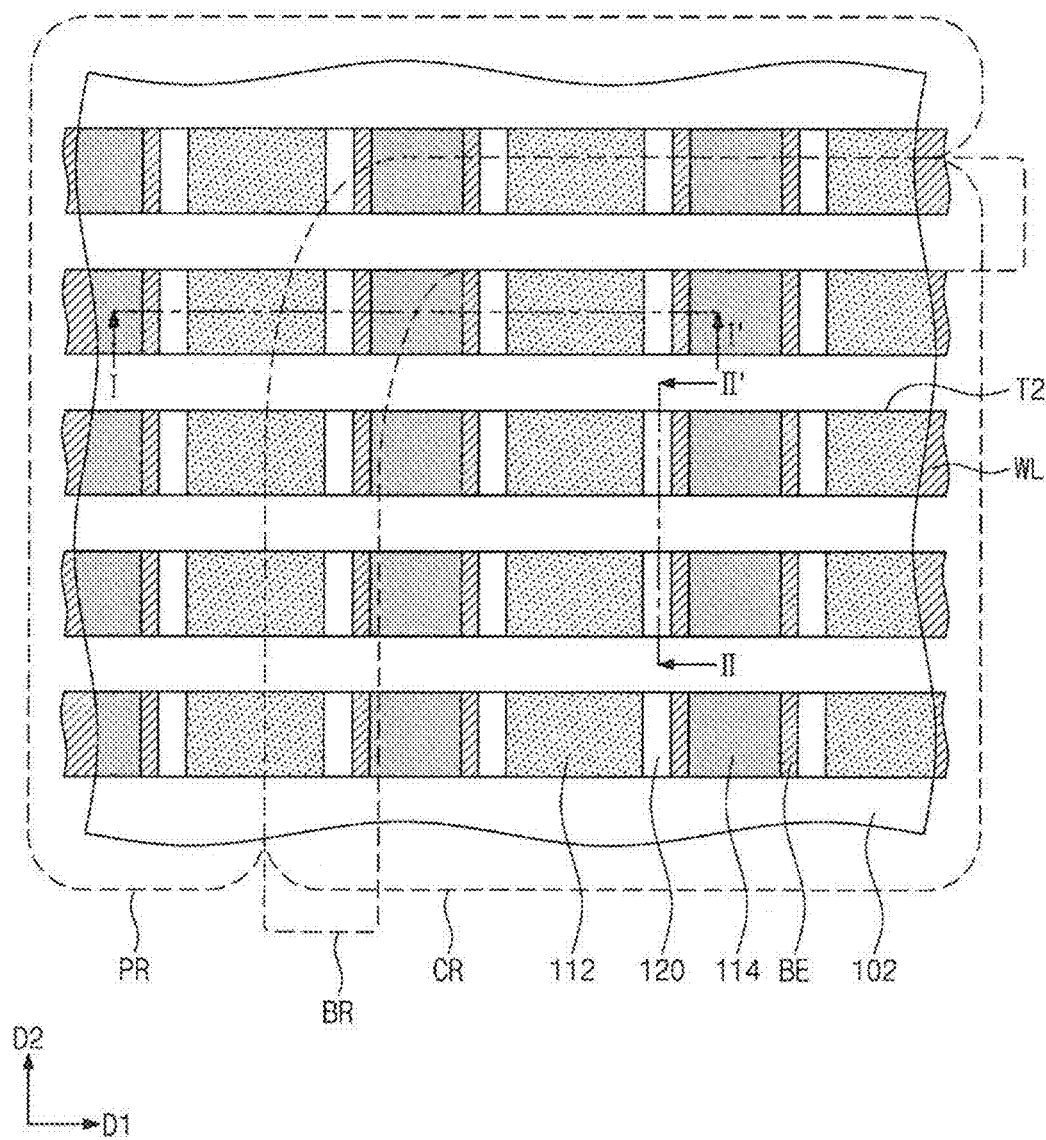
Figure 16B:
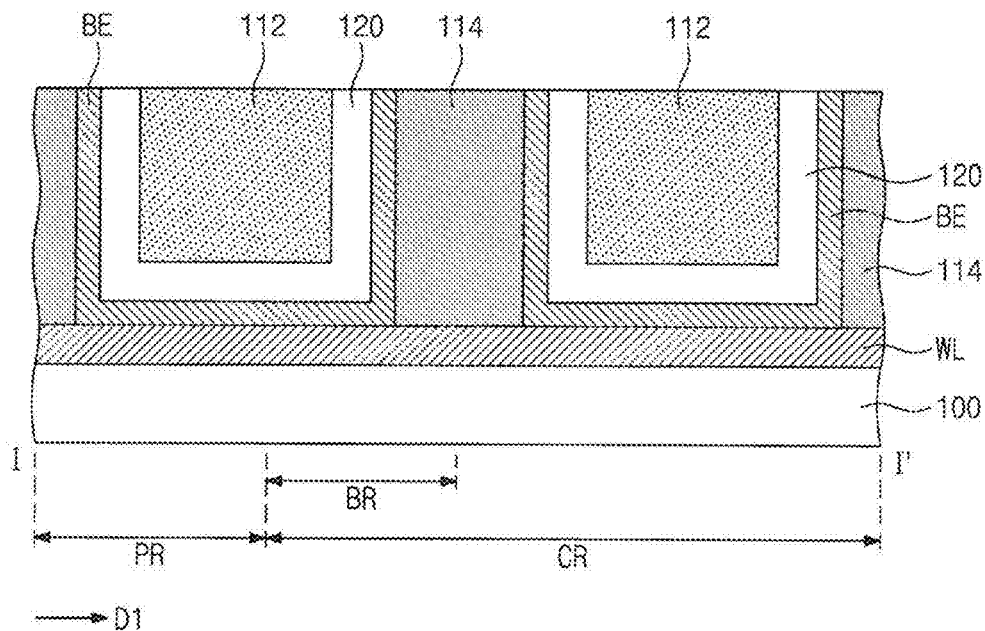
Figure 16C:
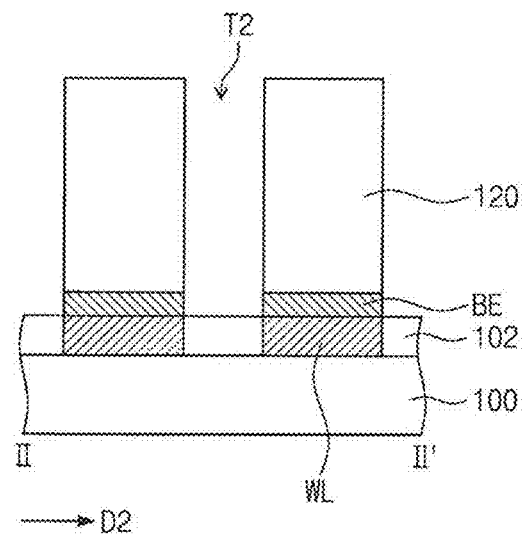

Referring to FIGS. 16A to 16C, bottom electrodes BE, spacers 120, and first insulating patterns 114 may be formed on the word lines WL. For example, the electrode pattern 107, the spacer pattern 109, the second insulating pattern 112 and the first insulating layer 104 may be etched using the second mask patterns M2 as an etch mask. Thus, a second trench T2 may be formed on the top surface of the first interlayer insulating layer 102 between the word lines WL.

The bottom electrodes BE may be spaced apart from each other in the first direction D1 and the second direction D2. The spacers 120 may be formed between the bottom electrodes BE and the second insulating patterns 112. The spacers 120 may be spaced apart from each other in the first direction D1 and the second direction D2. The first insulating patterns 114 may be spaced apart from each other in the first direction D1 and the second direction D2. The first insulating patterns 114 arranged in the second direction D2 may be spaced apart from each other with the second trench T2 interposed therebetween.

After the etching process is finished, the second mask patterns M2 may be removed.

Figure 17A:
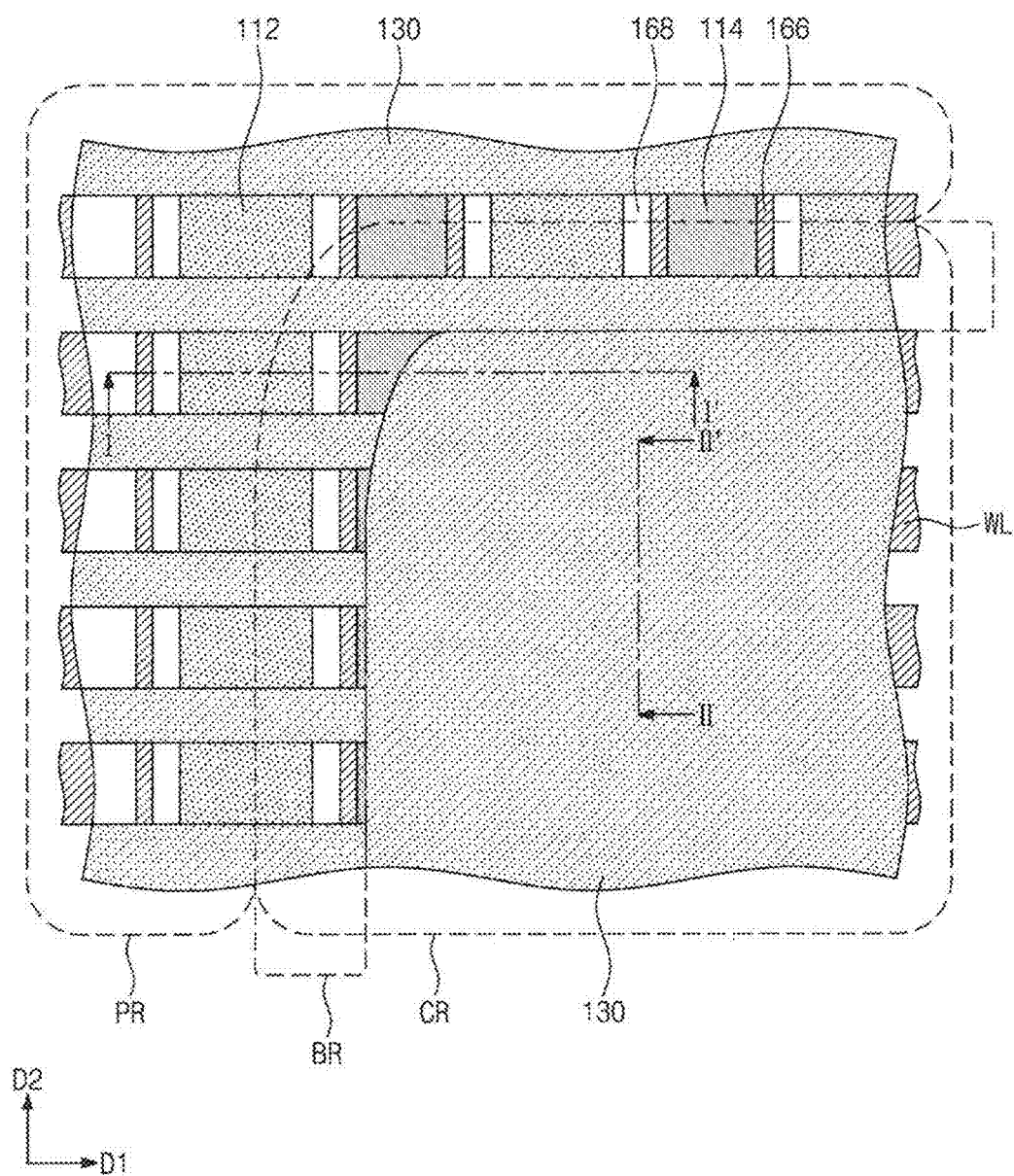
Figure 17B:
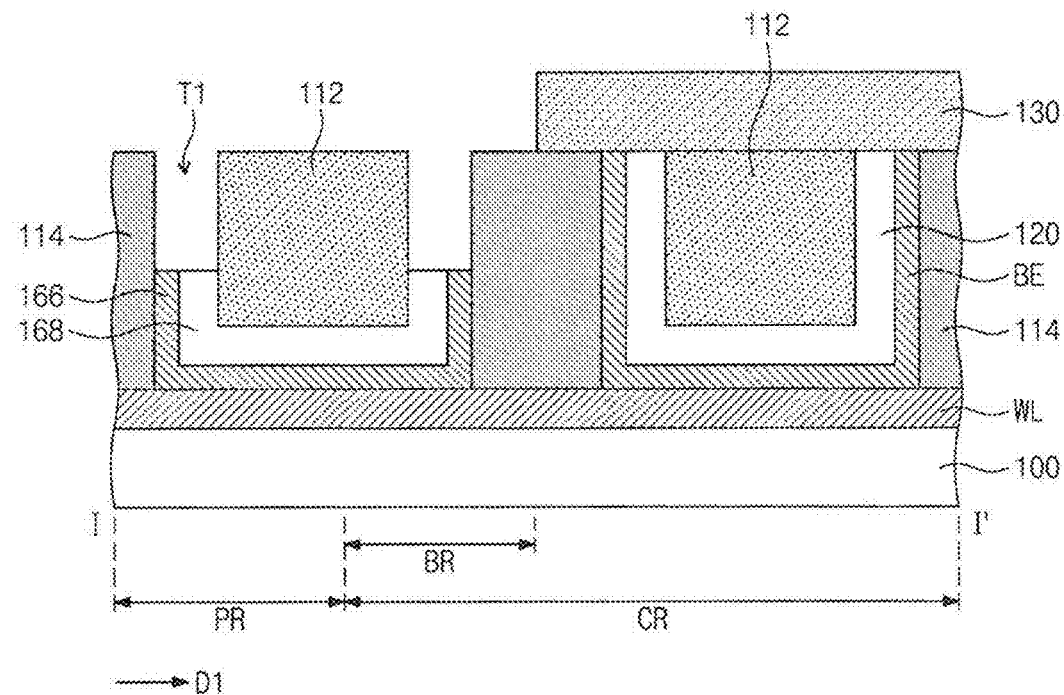
Figure 17C:
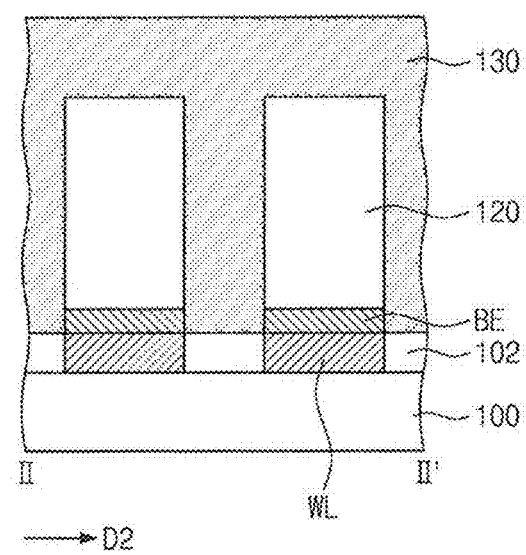

Referring to FIGS. 17A to 17C, portions of the bottom electrodes BE and portions of the spacers 120 on the boundary region BR may be removed. In detail, the bottom electrodes BE and the spacers 120 on the boundary region BR may be etched. For example, a third insulating pattern 130 may be formed on the substrate 100. The third insulating pattern 130 may cover the cell region CR and may fill the second trench T2. The bottom electrodes BE and the spacers 120 on the boundary region BR may be etched using the third insulating pattern 130 as an etch mask. The third insulating pattern 130 may be formed of, for example, the same insulating material as the first insulating patterns 114 and the second insulating patterns 112.

A portion of the bottom electrode BE and, a portion of the spacer 120 may remain in the first trench T1 on the boundary region BR after the etching process of the bottom electrode BE and the spacer 120. For example, on the boundary region BR, a portion of the bottom electrode BE may be removed to form a third portion 166 and a portion of the spacer 120 may be removed to form a fourth portion 168. A sidewall of the first trench T1 on the boundary region BR may be exposed by the etching process. At this time, the bottom electrodes BE and the spacers 120 on the peripheral region PR may also be etched.

Figure 18A:
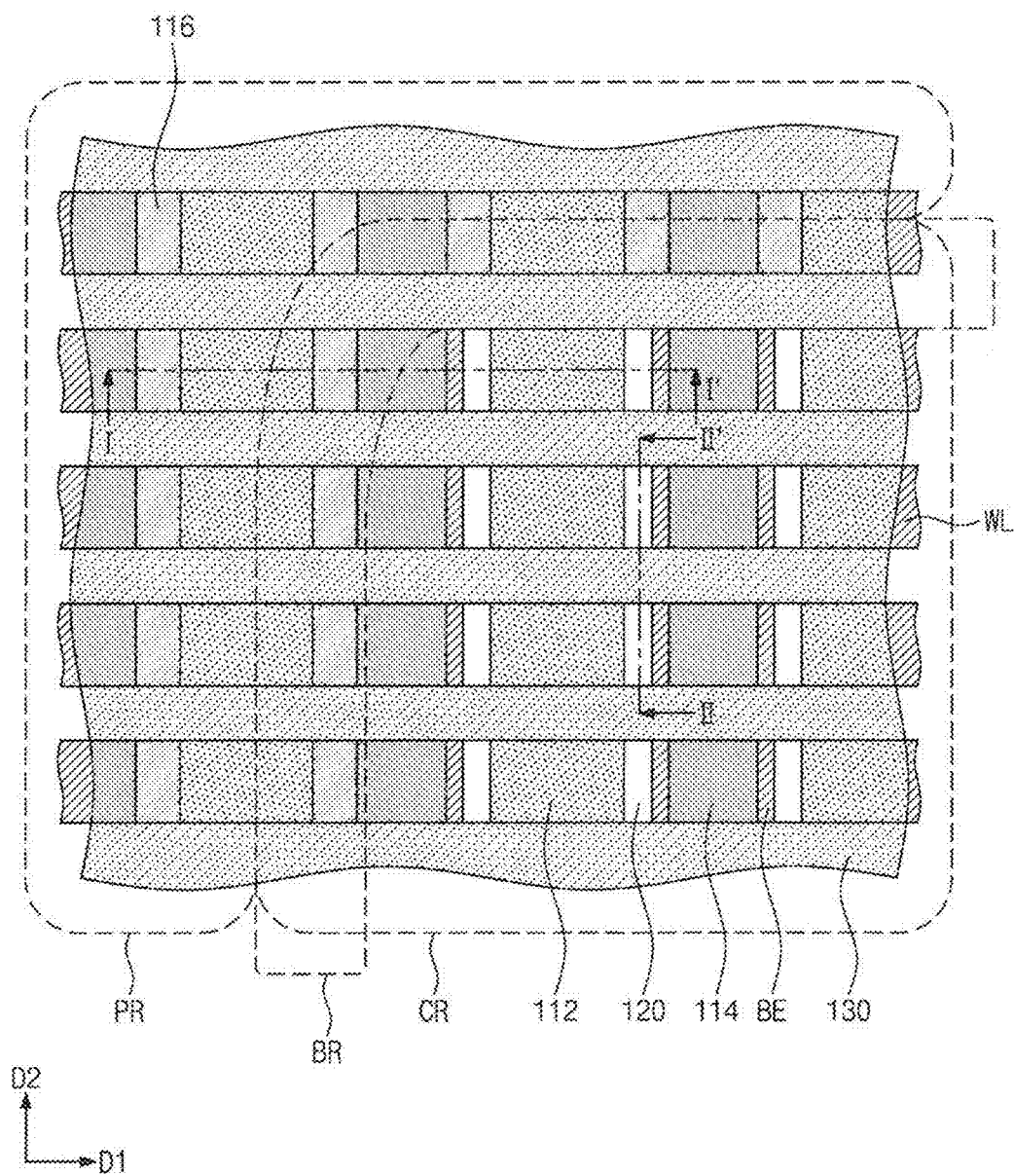
Figure 18B:
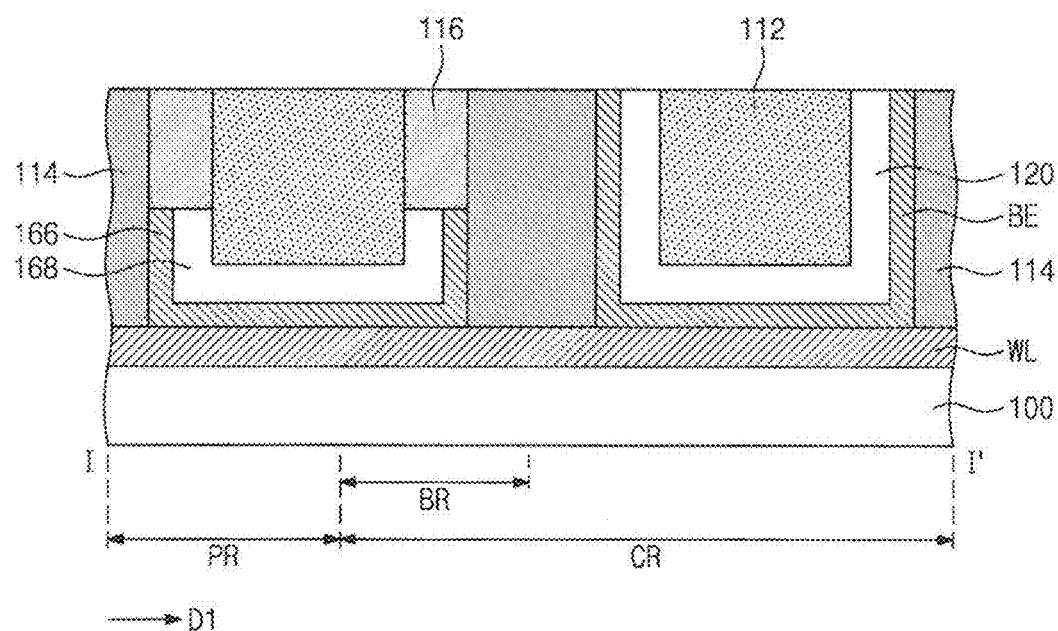
Figure 18C:
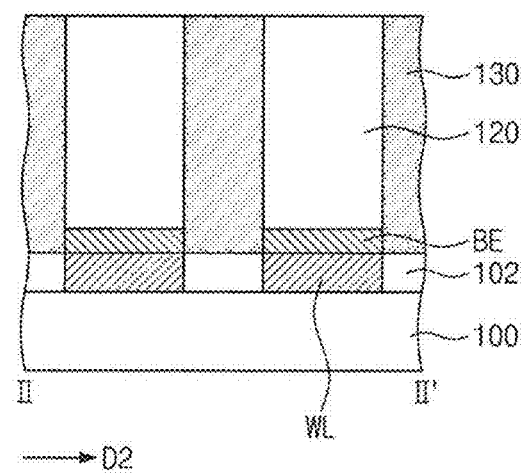

Referring to FIGS. 18A to 18C, a fourth insulating pattern 116 may be formed on the boundary region BR. The fourth insulating pattern 116 may be formed in, in some embodiments may fill a remaining region of the first trench T1 of the boundary region BR. In other words, the fourth insulating pattern 116 may be in contact with a top surface of the third portion 166 and a top surface of the fourth portion 168 on the boundary region BR. For example, an insulating layer may be formed in the remaining region of the first trench T1 on the boundary region B. In some embodiments, the insulating layer may fill the first trench T1 on the boundary region BR and the peripheral region PR. Thereafter, a planarization process may be performed on the insulating layer until top surfaces of the first insulating patterns 114 are exposed, thereby forming the fourth insulating pattern 116. At this time, the third insulating pattern 130 may also be planarized. The fourth insulating pattern 116 may cover the third portion 166 and the fourth portion 168 in the first trench T1 on the boundary region BR. In other words, the third portion 166 and the fourth portion 168 may be surrounded by the first to fourth insulating patterns 114, 112, 130 and 116 and may not be exposed.

Figure 19A:
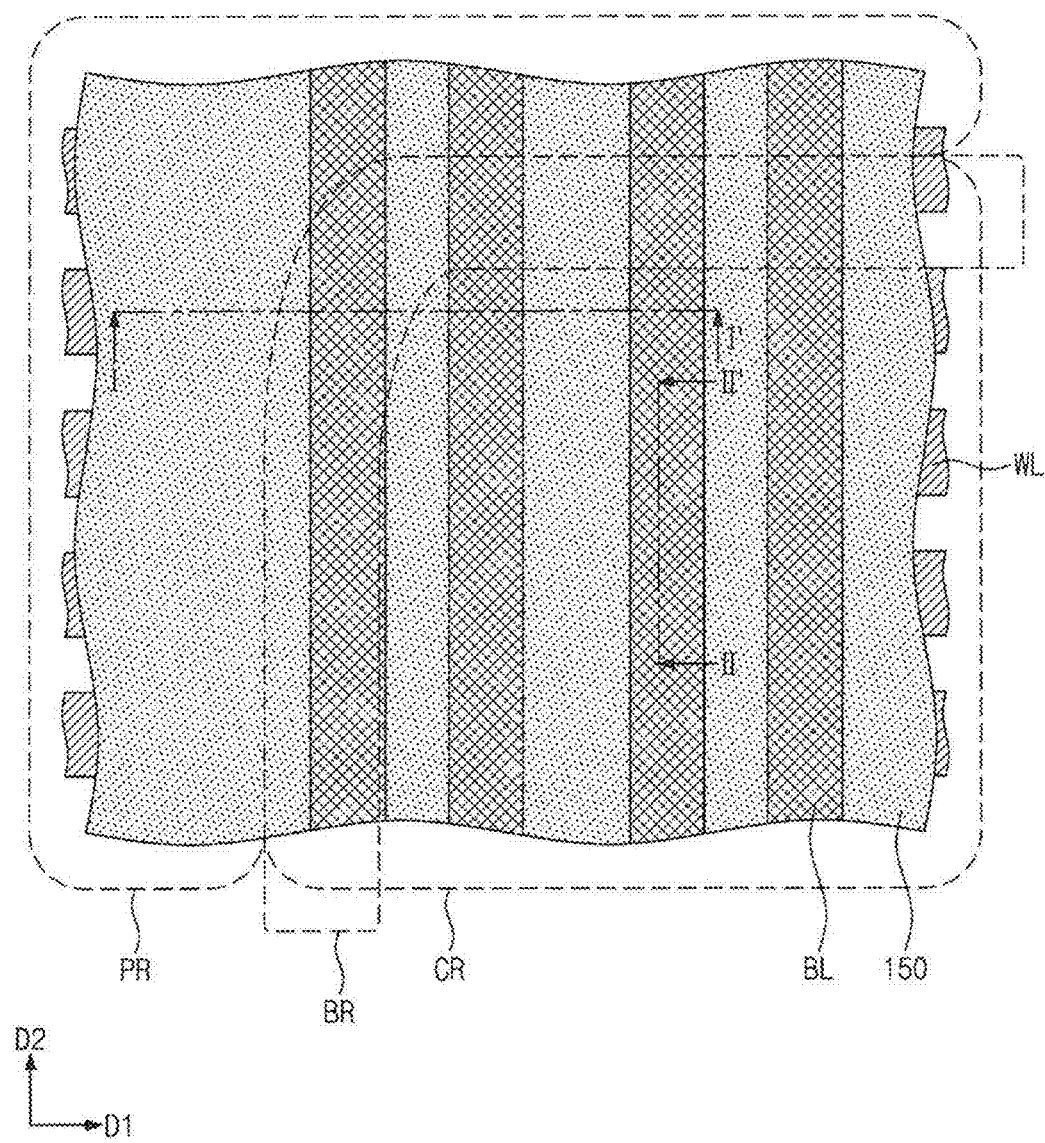
Figure 19B:
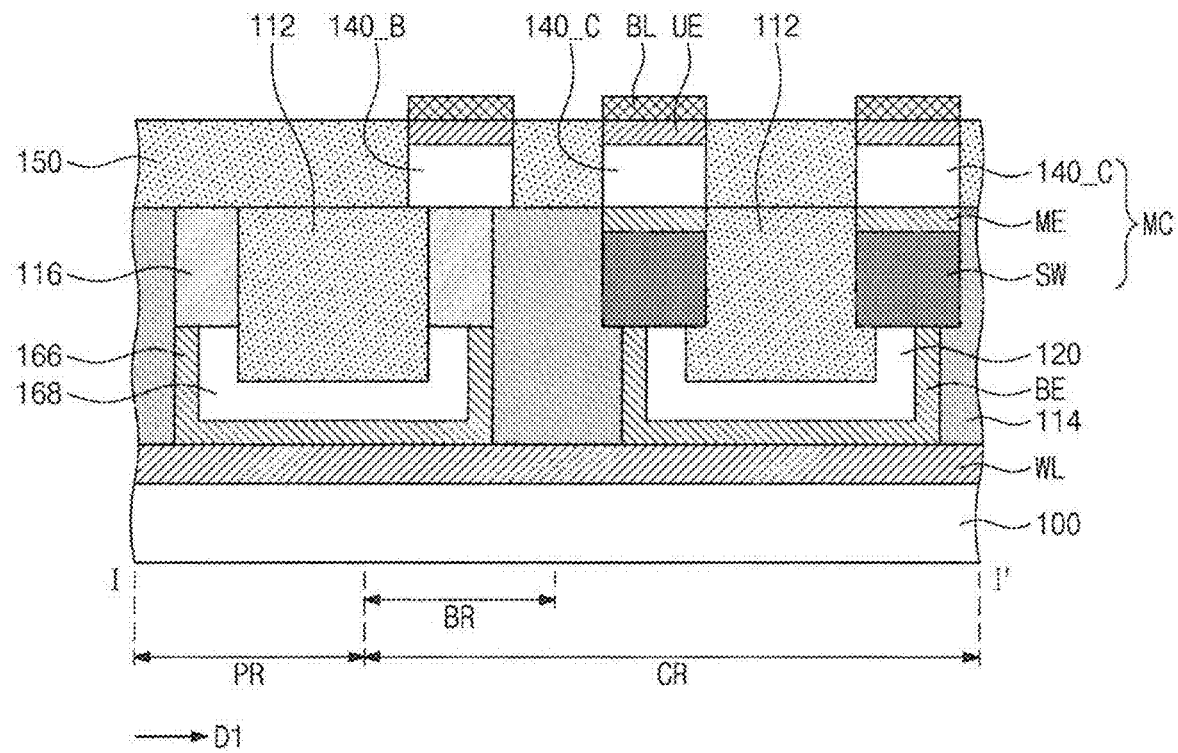
Figure 19C:
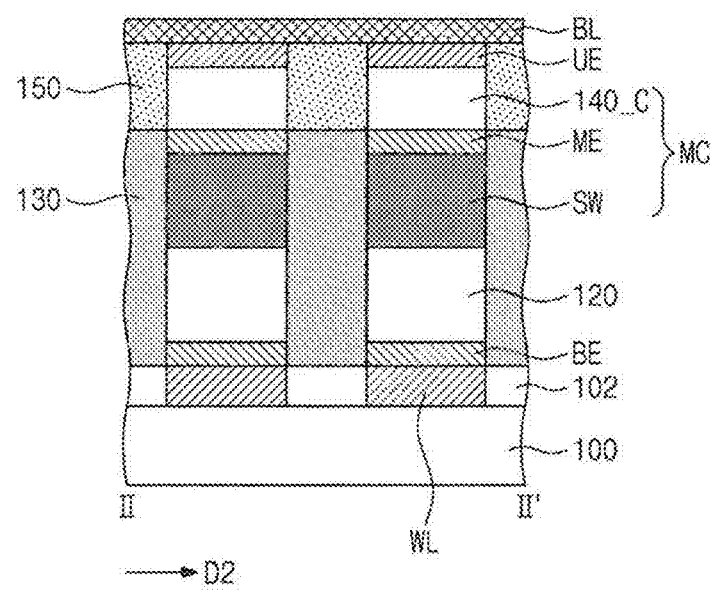

Referring to FIGS. 19A to 19C, memory cells and bit lines BL may be formed on the bottom electrodes BE. The bit lines DL may extend in the second direction D2. Each of the memory cells MCs may include a switching element SW and a variable resistance structure 140_C. At this time, the variable resistance structure 140_B on the boundary region BR may be formed on the fourth insulating pattern 116 and may be spaced apart from the third portion 166 and the fourth portion 168.

Upper portions of the bottom electrodes BE and upper portions of the spacers 120 that are on the cell region CR may be etched (e.g., sequentially etched) to form inner spaces surrounded by the first to third insulating patterns 114, 112 and 130 on the bottom electrodes BE and the spacers 120.

The switching element SW and an intermediate electrode ME may be sequentially formed in each of the inner spaces. In some embodiments, the switching elements SW may fill lower regions of the inner spaces, and the intermediate electrodes ME may be formed on top surfaces of the switching elements SW to fill upper regions of the inner spaces. At this time, the switching elements SW may not be formed on the boundary region BR.

The intermediate electrodes ME may be formed on the switching elements SW, respectively. In some embodiments, the intermediate electrodes ME may be formed to completely fill remaining regions of the inner spaces, which are not filled with the switching elements SW.

A second interlayer insulating layer 150 may be formed on the first to third insulating patterns 114, 112 and 130. The second interlayer insulating layer 150 may have openings (e.g., holes) exposing top surfaces of the intermediate electrodes ME, respectively.

One of the variable resistance structures 140_B and 140_C and one of top electrodes UE may be sequentially formed in each of the openings. The variable resistance structures 14_B and 140_C may fill lower regions of the openings, and the top electrodes UE may be formed on top surfaces of the variable resistance structures 140_B and 140_C to fill upper regions of the openings.

The bit lines BL may be formed on the top electrodes UE. The bit lines BL may extend in the second direction D2 to intersect the word lines WL. Each of the bit lines BL may be electrically connected to the top electrodes UE that are arranged in the second direction D2 and are spaced apart from each other in the second direction D2.

According to some embodiments of the inventive concepts, the memory cells on the peripheral region PR may be removed before the formation of the bit lines BL. Transistors for driving a semiconductor memory device (e.g., the memory cells) may be formed on the peripheral region PR from which the memory cells are removed.

In some embodiments, the process of removing a portion of the conductive layer 106 and a portion of the spacer layer 108 may be performed concurrently with the process of forming the memory cells.

Figure 20A:
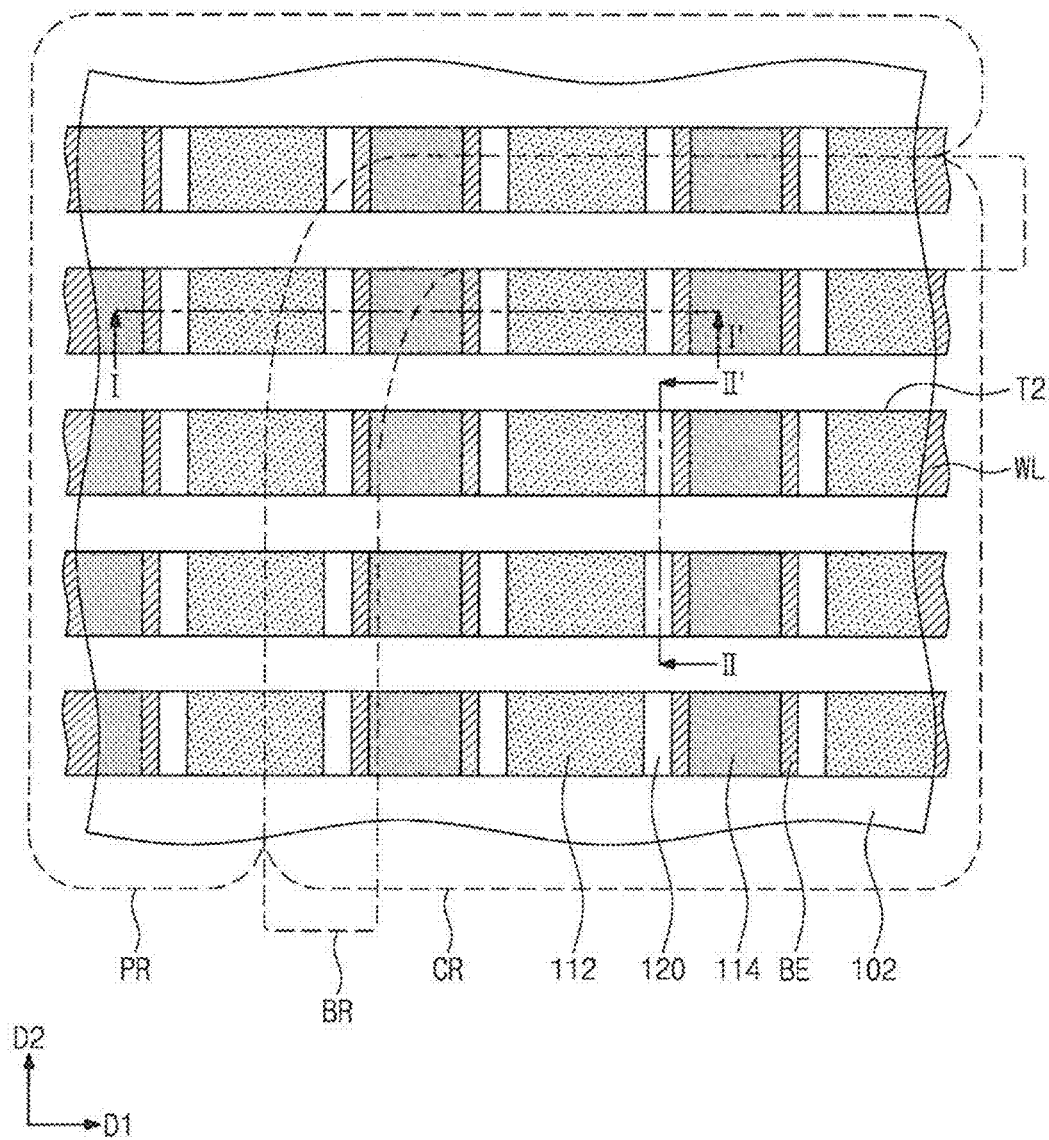
FIGS. 20A and 21A are plan, views illustrating a method of forming a variable resistance memory device according to some embodiments of the inventive concepts.
Figure 20B:
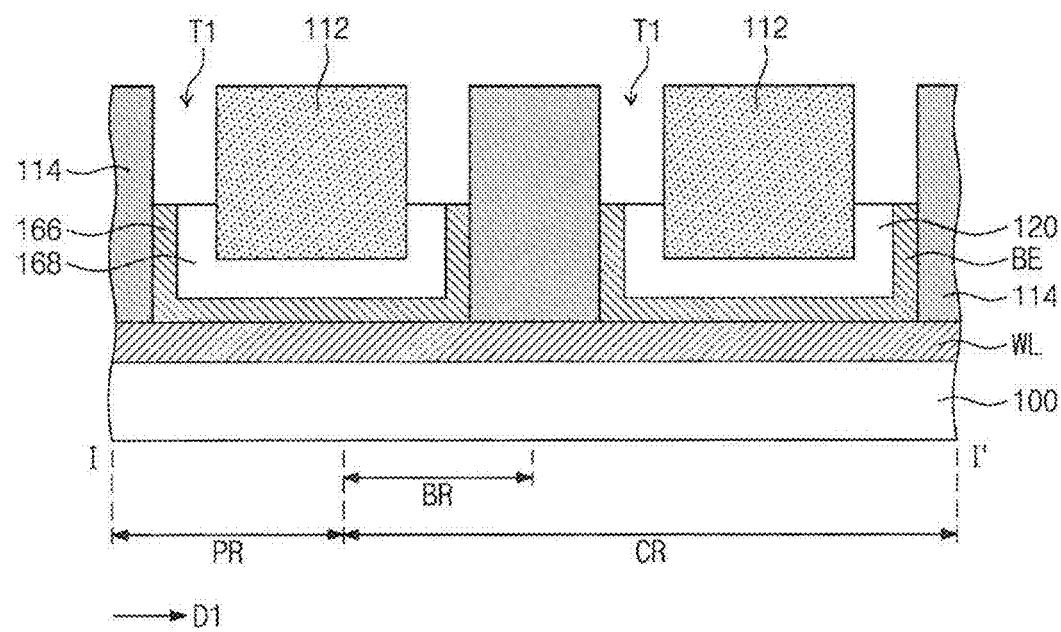
FIGS. 20B and 21B are cross-sectional views taken along the lines I-I' of FIGS. 20A and 21A, respectively.
Figure 20C:
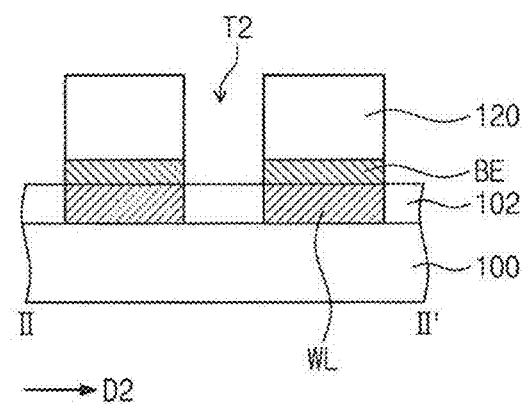
FIGS. 20C and 21C are cross-sectional views taken along the lines II-II' of FIGS. 20A and 21A, respectively.
Figure 21A:
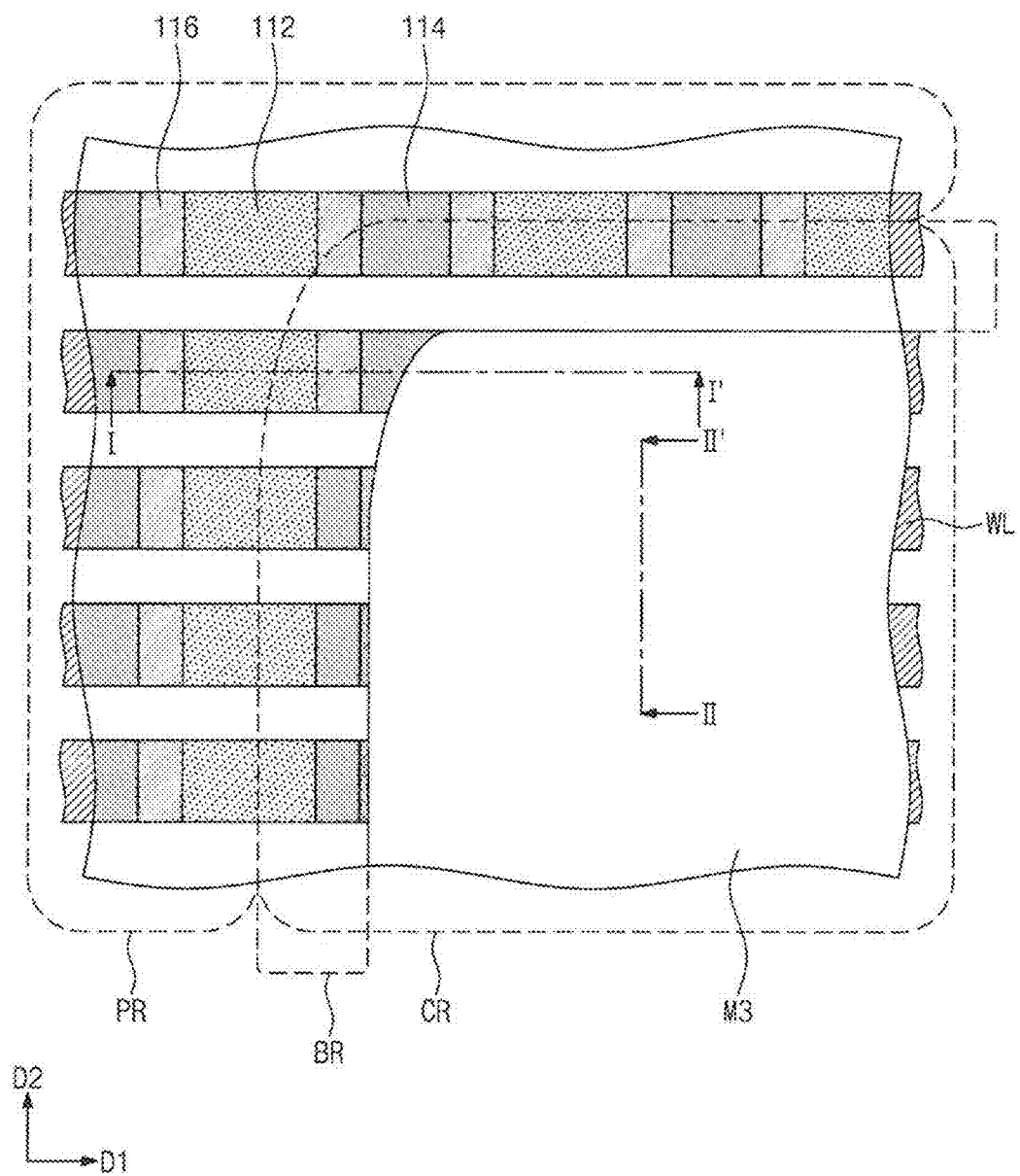
Figure 21B:
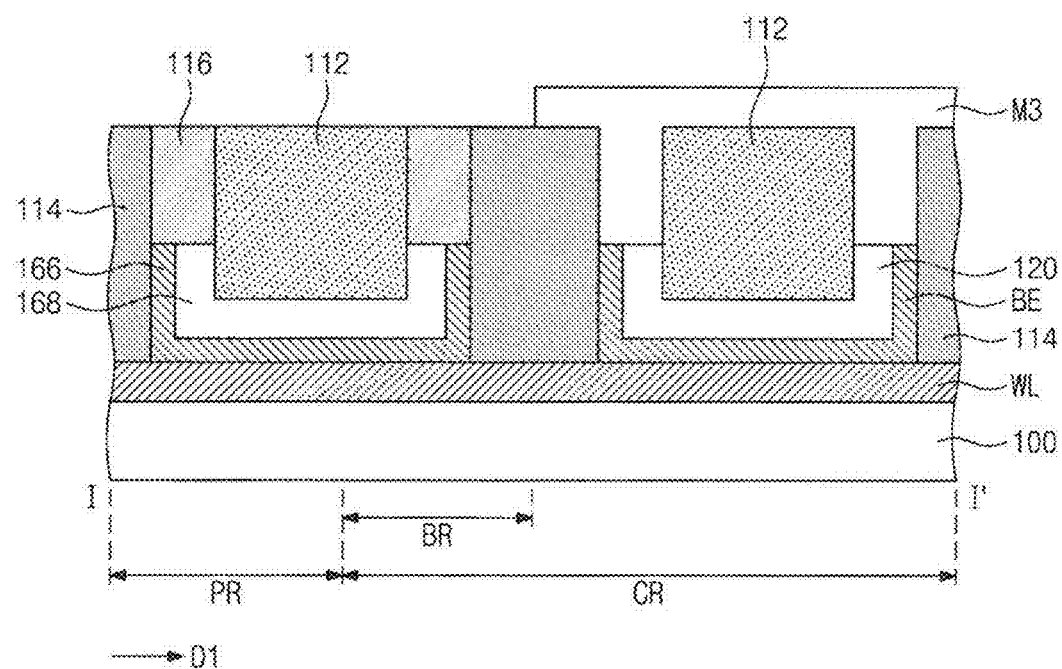
Figure 21C:
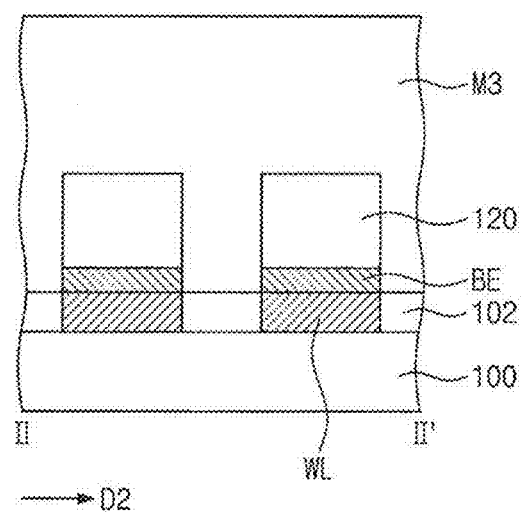

FIGS. 20A and 21A are plan, views illustrating a method of forming a variable resistance memory device according to some embodiments of the inventive concepts. FIGS. 20B and 21B are cross-sectional views taken along the lines I-I' of FIGS. 20A and 21A, respectively. FIGS. 20C and 21C are cross-sectional views taken along the lines II-II' of FIGS. 20A and 21A, respectively.

Referring to FIGS. 20A to 20C, the bottom electrodes BE and the spacers 120 of the resultant structure of FIGS. 16A to 16C may be etched. A portion of each of the bottom electrodes BE and a portion of each of the spacers 120 may remain on the bottom surface of the first trench T1 after the etching process of the bottom electrodes BE and the spacers 120. Upper portions of sidewalls of the first trenches T1 may be exposed by the etching process.

Referring to FIGS. 21A to 21C, a fourth insulating pattern 116 may be formed on the boundary region BR. The fourth insulating pattern 116 may be formed in, in some embodiments may fill, a remaining region of the first trench T1 disposed on the boundary region BR. For example, a third mask pattern M3 may be formed to cover the cell region. CR. The third mask pattern M3 may expose the boundary region BR. An insulating layer may be formed in the remaining region of the first trench T1 on the boundary region BR. Due to the third mask pattern M3, the insulating layer may not be formed in the first trench T1 of the cell region CR. Thereafter, a planarization process may be performed on the insulating layer and the third mask pattern M3 until top surfaces of the first insulating patterns 114 are exposed, thereby forming the fourth insulating pattern 116. Subsequently, a remaining portion of the third mask pattern M3 may be removed.

Thereafter, the same processes as described with reference to FIGS. 19A to 19C may be performed to form the memory cells and the bit lines BL on the bottom electrodes BE.

In some embodiments, a portion of the bottom electrode BE and a portion of the spacer 120 may remain in the first trench T1 of the boundary region BR after the etching process of the bottom electrodes BE and the spacers 120, as illustrated in FIG. 21B. In some embodiments, the bottom electrodes BE and the spacers 120 on the boundary region BR may be completely removed.

According to some embodiments of the inventive concepts, the memory cells that are damaged during etching processes of forming the transistors on the peripheral region PR may be electrically insulated from the word lines. Thus, the variable resistance memory device formed according to some embodiments of the inventive concepts may reduce or possibly inhibit a leakage current flowing through the damaged memory cells of the cell region.

In addition, the interlayer adhesive strength and the structural stability of the variable resistance memory device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing, description.

What is claimed is:

1. A variable resistance memory device comprising:
   a substrate comprising a cell region and a peripheral region, the cell region comprising a boundary region being in contact with the peripheral region;
   a plurality of first conductive lines extending in a first direction on the substrate;
   a plurality of second conductive lines extending in a second direction and traversing the plurality of first conductive lines;
   a plurality of variable resistance structures, each of the plurality of variable resistance structures being at one of a plurality of intersecting points of the plurality of first conductive lines and the plurality of second conductive lines; and
   a plurality of bottom electrodes between the plurality of first conductive lines and the plurality of variable resistance structures,
   wherein one of the plurality of first conductive lines is electrically insulated from one of the plurality of variable resistance structures that is on the boundary region and overlaps the one of the plurality of first conductive lines.

2. The variable resistance memory device of claim 1, further comprising:
   an insulating pattern that is on the boundary region and is between the one of the plurality of first conductive lines and the one of the plurality of variable resistance structures to insulate the one of the plurality of first conductive lines from the one of the plurality of variable resistance structures.

3. The variable resistance memory device of claim 2, wherein the insulating pattern is between a bottom surface of the one of the plurality of variable resistance structures and a top surface of one of the plurality of bottom electrodes that is overlapped by the one of the plurality of variable resistance structures.

4. The variable resistance memory device of claim 2, wherein the insulating pattern is in contact with a bottom surface of the one of the plurality of variable resistance structures and a top surface of the one of the plurality of first conductive lines.

5. The variable resistance memory device of claim 1, wherein each of the plurality of bottom electrodes comprises:
   a bottom portion electrically connected to the one of the plurality of first conductive lines; and
   a first sidewall portion and a second sidewall portion extending upwardly from opposing ends of the bottom portion, respectively,
   wherein the first sidewall portion and the second sidewall portion are connected to first and second ones of the plurality of variable resistance structures, respectively, that are directly adjacent to each other and are on the cell region.

6. The variable resistance memory device of claim 1, wherein the peripheral region is free of the plurality of variable resistance structures.

7. A variable resistance memory device comprising:
   a conductive line extending on a substrate; and
   a plurality of variable resistance structures comprising a first one of the plurality of variable resistance structures and a second one of the plurality of variable resistance structures that both overlap the conductive line,
   wherein the first one of the plurality of variable resistance structures is electrically insulated from the conductive line, and the second one of the plurality of variable resistance structures is configured to be electrically connected to the conductive line.

8. The variable resistance memory device of claim 7, wherein the first one of the plurality of variable resistance structures and the second one of the plurality of variable resistance structures comprise directly adjacent ones of the plurality of variable resistance structures.

9. The variable resistance memory device of claim 7, further comprising:
   a bottom electrode that is between the conductive line and the first one of the plurality of variable resistance structures and is overlapped by the first one of the plurality of variable resistance structures; and
   an insulating layer on the bottom electrode, wherein an upper surface of the bottom electrode that faces the first one of the plurality of variable resistance structures contacts the insulating layer.

10. The variable resistance memory device of claim 9, wherein an entirety of the upper surface of the bottom electrode contacts the insulating layer.

11. The variable resistance memory device of claim 9, wherein a lower surface of the bottom electrode contacts the conductive line.

12. The variable resistance memory device of claim 7, further comprising an insulating layer between the conductive line and the first one of the plurality of variable resistance structures,
   wherein the first one of the plurality of variable resistance structures comprises a lower surface facing the conductive line, and
   wherein the lower surface of the first one of the plurality of variable resistance structures contacts the insulating layer.

13. The variable resistance memory device of claim 12, wherein an entirety of the lower surface of the first one of the plurality of variable resistance structures contacts the insulating layer.

14. The variable resistance memory device of claim 7, further comprising an insulating layer between the conductive line and the first one of the plurality of variable resistance structures,
   wherein the conductive line comprises a portion that is overlapped by the first one of the plurality of variable resistance structures, and
   wherein an upper surface of the portion of the conductive line facing the first one of the plurality of variable resistance structures contacts the insulating layer.

15. The variable resistance memory device of claim 7, wherein the conductive line comprises a word line.

* * * * *